US009978904B2

(12) United States Patent
Krames et al.

(10) Patent No.: US 9,978,904 B2
(45) Date of Patent: *May 22, 2018

(54) INDIUM GALLIUM NITRIDE LIGHT EMITTING DEVICES

(71) Applicant: SORAA, INC., Fremont, CA (US)

(72) Inventors: Michael R. Krames, Mountain View, CA (US); Mark P. D'Evelyn, Santa Barbara, CA (US); Akinori Koukitu, Tokyo (JP); Yoshinao Kumagai, Tokyo (JP); Hisashi Murakami, Tokyo (JP)

(73) Assignee: Soraa, Inc., Fremont, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/054,234

(22) Filed: Oct. 15, 2013

(65) Prior Publication Data

US 2014/0103356 A1    Apr. 17, 2014

Related U.S. Application Data

(60) Provisional application No. 61/714,693, filed on Oct. 16, 2012.

(51) Int. Cl.
    *H01L 33/00* (2010.01)
    *H01L 33/16* (2010.01)
    *H01L 33/32* (2010.01)

(52) U.S. Cl.
    CPC .......... *H01L 33/0075* (2013.01); *H01L 33/16* (2013.01); *H01L 33/32* (2013.01)

(58) Field of Classification Search
    CPC .................................. H01L 33/0075
    USPC ................................ 257/9; 438/46
    See application file for complete search history.

(56) References Cited

U.S. PATENT DOCUMENTS

| | | |
|---|---|---|
| 3,283,143 A | 11/1966 | Gosnell |
| 3,621,233 A | 11/1971 | Ferdinand et al. |
| 3,647,522 A | 3/1972 | Single |
| 4,065,688 A | 12/1977 | Thornton |
| 4,066,868 A | 1/1978 | Witkin et al. |
| 4,225,904 A | 9/1980 | Linder |
| 4,350,560 A | 9/1982 | Helgeland et al. |
| 4,581,646 A | 4/1986 | Kubodera |
| 4,870,045 A | 9/1989 | Gasper et al. |
| 5,005,109 A | 4/1991 | Carleton |
| 5,142,387 A | 8/1992 | Shikama et al. |
| 5,169,486 A | 12/1992 | Young et al. |
| 5,331,654 A | 7/1994 | Jewell et al. |
| 5,366,953 A | 11/1994 | Char et al. |

(Continued)

FOREIGN PATENT DOCUMENTS

| | | |
|---|---|---|
| EP | 0961328 | 12/1999 |
| EP | 2381490 | 10/2011 |

(Continued)

OTHER PUBLICATIONS

M. A. Mastro et al., "Hydride Vapor Phase Epitaxy-Grown AlGaN/GaN High Electron Mobility Transistors," Solid-State Electronics 47 (2003) 1075-1079.*

(Continued)

*Primary Examiner* — Thao X Le
*Assistant Examiner* — Xia Cross

(57) ABSTRACT

InGaN-based light-emitting devices fabricated on an InGaN template layer are disclosed.

18 Claims, 11 Drawing Sheets
(4 of 11 Drawing Sheet(s) Filed in Color)

(56) References Cited

U.S. PATENT DOCUMENTS

| | | |
|---|---|---|
| 5,607,899 A | 3/1997 | Yoshida et al. |
| 5,632,812 A | 5/1997 | Hirabayashi |
| 5,685,885 A | 11/1997 | Khandros et al. |
| 5,764,674 A | 6/1998 | Hibbs-Brenner et al. |
| 5,813,753 A | 9/1998 | Vriens et al. |
| 5,926,493 A | 7/1999 | O'Brien et al. |
| 6,069,394 A | 5/2000 | Hashimoto et al. |
| 6,072,197 A | 6/2000 | Horino et al. |
| 6,147,953 A | 11/2000 | Duncan |
| 6,195,381 B1 | 2/2001 | Botez et al. |
| 6,275,145 B1 | 8/2001 | Rogozinski |
| 6,335,771 B1 | 1/2002 | Hiraishi |
| 6,379,985 B1 | 4/2002 | Cervantes et al. |
| 6,498,355 B1 | 12/2002 | Harrah et al. |
| 6,501,154 B2 | 12/2002 | Morita et al. |
| 6,509,651 B1 | 1/2003 | Matsubara et al. |
| 6,533,874 B1 | 3/2003 | Vaudo et al. |
| 6,547,249 B2 | 4/2003 | Collins, III et al. |
| 6,586,762 B2 | 7/2003 | Kozaki |
| 6,680,959 B2 | 1/2004 | Tanabe et al. |
| 6,734,461 B1 | 5/2004 | Shiomi et al. |
| 6,809,781 B2 | 10/2004 | Setlur et al. |
| 6,853,010 B2 | 2/2005 | Slater, Jr. et al. |
| 6,860,628 B2 * | 3/2005 | Robertson et al. ....... F21V 7/04 |
| 6,864,641 B2 | 3/2005 | Dygert |
| 6,889,006 B2 | 5/2005 | Kobayashi |
| 6,956,246 B1 | 10/2005 | Epler et al. |
| 6,989,807 B2 | 1/2006 | Chiang |
| 7,009,199 B2 | 3/2006 | Hall |
| 7,012,279 B2 | 3/2006 | Wierer, Jr. et al. |
| 7,019,325 B2 | 3/2006 | Li et al. |
| 7,081,722 B1 | 7/2006 | Huynh et al. |
| 7,083,302 B2 | 8/2006 | Chen et al. |
| 7,113,658 B2 | 9/2006 | Ide et al. |
| 7,128,849 B2 | 10/2006 | Setlur et al. |
| 7,148,515 B1 | 12/2006 | Huang et al. |
| 7,193,246 B1 | 3/2007 | Tanizawa et al. |
| 7,252,408 B2 | 8/2007 | Mazzochette et al. |
| 7,253,446 B2 | 8/2007 | Sakuma et al. |
| 7,279,040 B1 | 10/2007 | Wang |
| 7,285,801 B2 | 10/2007 | Eliashevich et al. |
| 7,303,630 B2 | 12/2007 | Motoki et al. |
| 7,318,651 B2 | 1/2008 | Chua et al. |
| 7,341,880 B2 | 3/2008 | Erchak et al. |
| 7,348,600 B2 | 3/2008 | Narukawa et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,419,281 B2 | 9/2008 | Porchia et al. |
| 7,470,555 B2 | 12/2008 | Matsumura |
| 7,470,938 B2 | 12/2008 | Lee et al. |
| 7,483,466 B2 | 1/2009 | Uchida et al. |
| 7,489,441 B2 | 2/2009 | Scheible et al. |
| 7,491,984 B2 | 2/2009 | Koike et al. |
| 7,518,159 B2 | 4/2009 | Masui et al. |
| 7,560,981 B2 | 7/2009 | Chao et al. |
| 7,566,639 B2 | 7/2009 | Kohda |
| 7,598,104 B2 | 10/2009 | Teng et al. |
| 7,622,742 B2 | 11/2009 | Kim et al. |
| 7,733,571 B1 | 6/2010 | Li |
| 7,772,585 B2 | 8/2010 | Uematsu et al. |
| 7,816,238 B2 | 10/2010 | Osada et al. |
| 7,858,408 B2 | 12/2010 | Mueller et al. |
| 7,862,761 B2 | 1/2011 | Okushima et al. |
| 7,871,839 B2 | 1/2011 | Lee et al. |
| 7,884,538 B2 | 2/2011 | Mitsuishi et al. |
| 7,906,793 B2 | 3/2011 | Negley |
| 7,923,741 B1 | 4/2011 | Zhai et al. |
| 7,976,630 B2 | 7/2011 | Poblenz et al. |
| 7,997,774 B2 | 8/2011 | Liddle |
| 8,044,412 B2 | 10/2011 | Murphy et al. |
| 8,044,609 B2 | 10/2011 | Liu |
| 8,062,726 B2 | 11/2011 | Greiner et al. |
| 8,142,566 B2 | 3/2012 | Kiyomi et al. |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,207,554 B2 | 6/2012 | Shum |
| D662,899 S | 7/2012 | Shum et al. |
| D662,900 S | 7/2012 | Shum et al. |
| 8,247,886 B1 | 8/2012 | Sharma et al. |
| 8,247,887 B1 | 8/2012 | Raring et al. |
| 8,252,662 B1 | 8/2012 | Poblenz et al. |
| 8,269,245 B1 | 9/2012 | Shum |
| 8,293,551 B2 | 10/2012 | Sharma et al. |
| 8,304,265 B2 | 11/2012 | Nakamura et al. |
| 8,310,143 B2 | 11/2012 | Van De Ven et al. |
| 8,314,429 B1 | 11/2012 | Raring et al. |
| 8,324,835 B2 | 12/2012 | Shum et al. |
| 8,324,840 B2 | 12/2012 | Shteynberg et al. |
| 8,350,273 B2 | 1/2013 | Vielemeyer |
| 8,351,478 B2 | 1/2013 | Raring et al. |
| 8,355,418 B2 | 1/2013 | Raring et al. |
| 8,362,603 B2 | 1/2013 | Lim et al. |
| 8,404,071 B2 | 3/2013 | Cope et al. |
| 8,410,711 B2 | 4/2013 | Lin et al. |
| 8,410,717 B2 | 4/2013 | Shteynberg et al. |
| 8,431,942 B2 | 4/2013 | Butterworth |
| 8,455,894 B1 | 6/2013 | D'Evelyn et al. |
| 8,477,259 B2 | 7/2013 | Kubota et al. |
| 8,502,465 B2 | 8/2013 | Katona et al. |
| 8,519,437 B2 | 8/2013 | Chakraborty |
| 8,524,578 B1 | 9/2013 | Raring et al. |
| 8,541,951 B1 | 9/2013 | Shum et al. |
| 8,575,642 B1 | 11/2013 | Shum |
| 8,575,728 B1 | 11/2013 | Raring et al. |
| 8,597,967 B1 | 12/2013 | Krames et al. |
| 8,651,711 B2 | 2/2014 | Rudisill et al. |
| 8,674,395 B2 | 3/2014 | Shum |
| 8,686,431 B2 | 4/2014 | Batres et al. |
| 8,704,258 B2 | 4/2014 | Tasaki et al. |
| 8,746,918 B1 | 6/2014 | Rubino |
| 8,752,975 B2 | 6/2014 | Rubino |
| 8,786,053 B2 | 7/2014 | D'Evelyn et al. |
| 8,791,499 B1 | 7/2014 | Sharma et al. |
| 8,888,332 B2 | 11/2014 | Martis et al. |
| 8,896,235 B1 | 11/2014 | Shum et al. |
| 8,912,025 B2 | 12/2014 | Felker et al. |
| 8,946,865 B2 | 2/2015 | D'Evelyn et al. |
| 2001/0009134 A1 | 7/2001 | Kim et al. |
| 2001/0022495 A1 | 9/2001 | Salam |
| 2001/0043042 A1 | 11/2001 | Murazaki et al. |
| 2001/0055208 A1 | 12/2001 | Kimura |
| 2002/0027933 A1 | 3/2002 | Tanabe et al. |
| 2002/0050488 A1 | 5/2002 | Nikitin et al. |
| 2002/0070416 A1 | 6/2002 | Morse et al. |
| 2002/0088985 A1 | 7/2002 | Komoto et al. |
| 2002/0096994 A1 | 7/2002 | Iwafuchi et al. |
| 2002/0127824 A1 | 9/2002 | Shelton et al. |
| 2002/0155691 A1 | 10/2002 | Lee et al. |
| 2002/0182768 A1 | 12/2002 | Morse et al. |
| 2002/0190260 A1 | 12/2002 | Shen et al. |
| 2003/0000453 A1 | 1/2003 | Unno et al. |
| 2003/0001238 A1 | 1/2003 | Ban |
| 2003/0020087 A1 | 1/2003 | Goto et al. |
| 2003/0045042 A1 | 3/2003 | Biwa et al. |
| 2003/0047076 A1 | 3/2003 | Liu |
| 2003/0080345 A1 | 5/2003 | Motoki et al. |
| 2003/0164507 A1 | 9/2003 | Edmond et al. |
| 2003/0178617 A1 | 9/2003 | Appenzeller et al. |
| 2003/0216011 A1 | 11/2003 | Nakamura et al. |
| 2004/0051107 A1 | 3/2004 | Nagahama et al. |
| 2004/0070004 A1 | 4/2004 | Eliashevich et al. |
| 2004/0080256 A1 | 4/2004 | Hampden-Smith et al. |
| 2004/0104391 A1 | 6/2004 | Maeda et al. |
| 2004/0116033 A1 | 6/2004 | Ouderkirk et al. |
| 2004/0124435 A1 | 7/2004 | D'Evelyn et al. |
| 2004/0161222 A1 | 8/2004 | Niida et al. |
| 2004/0164308 A1 * | 8/2004 | Asatsuma et al. ............ 257/94 |
| 2004/0190304 A1 | 9/2004 | Sugimoto et al. |
| 2004/0196877 A1 | 10/2004 | Kawakami et al. |
| 2004/0201598 A1 | 10/2004 | Eliav et al. |
| 2004/0207998 A1 | 10/2004 | Suehiro et al. |

(56) References Cited

U.S. PATENT DOCUMENTS

| | | |
|---|---|---|
| 2004/0227149 A1 | 11/2004 | Ibbetson et al. |
| 2004/0245543 A1 | 12/2004 | Yoo |
| 2004/0251471 A1 | 12/2004 | Dwilinski et al. |
| 2005/0001227 A1 | 1/2005 | Niki et al. |
| 2005/0012446 A1 | 1/2005 | Jermann et al. |
| 2005/0045894 A1 | 3/2005 | Okuyama et al. |
| 2005/0084218 A1 | 4/2005 | Ide et al. |
| 2005/0087753 A1 | 4/2005 | D'Evelyn et al. |
| 2005/0121679 A1 | 6/2005 | Nagahama et al. |
| 2005/0140270 A1 | 6/2005 | Henson et al. |
| 2005/0167680 A1 | 8/2005 | Shei et al. |
| 2005/0179376 A1 | 8/2005 | Fung et al. |
| 2005/0199899 A1 | 9/2005 | Lin et al. |
| 2005/0214992 A1 | 9/2005 | Chakraborty et al. |
| 2005/0224830 A1 | 10/2005 | Blonder et al. |
| 2005/0230701 A1 | 10/2005 | Huang |
| 2005/0232327 A1* | 10/2005 | Nomura et al. ......... H01S 5/00 |
| 2005/0263791 A1 | 12/2005 | Yanagihara et al. |
| 2006/0006404 A1 | 1/2006 | Ibbetson et al. |
| 2006/0038542 A1 | 2/2006 | Park et al. |
| 2006/0060131 A1 | 3/2006 | Atanackovic |
| 2006/0060872 A1 | 3/2006 | Edmond et al. |
| 2006/0065900 A1 | 3/2006 | Hsieh et al. |
| 2006/0068154 A1 | 3/2006 | Parce et al. |
| 2006/0077795 A1 | 4/2006 | Kitahara et al. |
| 2006/0079082 A1 | 4/2006 | Bruhns et al. |
| 2006/0097385 A1 | 5/2006 | Negley |
| 2006/0118799 A1 | 6/2006 | D'Evelyn et al. |
| 2006/0124051 A1 | 6/2006 | Yoshioka et al. |
| 2006/0152795 A1 | 7/2006 | Yang |
| 2006/0163589 A1 | 7/2006 | Fan et al. |
| 2006/0166390 A1 | 7/2006 | Letertre et al. |
| 2006/0169993 A1 | 8/2006 | Fan et al. |
| 2006/0177362 A1 | 8/2006 | D'Evelyn et al. |
| 2006/0180828 A1 | 8/2006 | Kim et al. |
| 2006/0186418 A1 | 8/2006 | Edmond et al. |
| 2006/0189098 A1 | 8/2006 | Edmond |
| 2006/0204865 A1 | 9/2006 | Erchak et al. |
| 2006/0208262 A1 | 9/2006 | Sakuma et al. |
| 2006/0214287 A1 | 9/2006 | Ogihara et al. |
| 2006/0255343 A1 | 11/2006 | Ogihara et al. |
| 2006/0256482 A1 | 11/2006 | Araki et al. |
| 2006/0261364 A1 | 11/2006 | Suehiro et al. |
| 2006/0273339 A1 | 12/2006 | Steigerwald et al. |
| 2006/0288927 A1 | 12/2006 | Chodelka et al. |
| 2006/0288928 A1 | 12/2006 | Eom et al. |
| 2007/0045200 A1 | 3/2007 | Moon et al. |
| 2007/0054476 A1 | 3/2007 | Nakahata et al. |
| 2007/0062440 A1 | 3/2007 | Sato et al. |
| 2007/0072324 A1* | 3/2007 | Krames et al. ............... 438/46 |
| 2007/0091608 A1 | 4/2007 | Hauffe et al. |
| 2007/0093073 A1 | 4/2007 | Farrell, Jr. et al. |
| 2007/0096239 A1 | 5/2007 | Cao et al. |
| 2007/0105351 A1 | 5/2007 | Motoki et al. |
| 2007/0114563 A1 | 5/2007 | Paek et al. |
| 2007/0114569 A1 | 5/2007 | Wu et al. |
| 2007/0121690 A1 | 5/2007 | Fujii et al. |
| 2007/0126023 A1 | 6/2007 | Haskell et al. |
| 2007/0131967 A1 | 6/2007 | Kawaguchi et al. |
| 2007/0170450 A1 | 7/2007 | Murphy |
| 2007/0181895 A1 | 8/2007 | Nagai |
| 2007/0202624 A1 | 8/2007 | Yoon et al. |
| 2007/0217462 A1 | 9/2007 | Yamasaki |
| 2007/0231963 A1 | 10/2007 | Doan et al. |
| 2007/0231978 A1 | 10/2007 | Kanamoto et al. |
| 2007/0264733 A1 | 11/2007 | Choi et al. |
| 2007/0280320 A1 | 12/2007 | Feezell et al. |
| 2007/0290224 A1 | 12/2007 | Ogawa |
| 2008/0023691 A1 | 1/2008 | Jang et al. |
| 2008/0030976 A1 | 2/2008 | Murazaki et al. |
| 2008/0054290 A1 | 3/2008 | Shieh et al. |
| 2008/0073660 A1 | 3/2008 | Ohno et al. |
| 2008/0083929 A1 | 4/2008 | Fan et al. |
| 2008/0087919 A1 | 4/2008 | Tysoe et al. |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0121913 A1 | 5/2008 | McKenzie et al. |
| 2008/0128752 A1 | 6/2008 | Wu |
| 2008/0142781 A1 | 6/2008 | Lee |
| 2008/0151543 A1 | 6/2008 | Wang |
| 2008/0164489 A1 | 7/2008 | Schmidt et al. |
| 2008/0164578 A1 | 7/2008 | Tanikella et al. |
| 2008/0173884 A1 | 7/2008 | Chitnis et al. |
| 2008/0179607 A1 | 7/2008 | DenBaars et al. |
| 2008/0179610 A1 | 7/2008 | Okamoto et al. |
| 2008/0191192 A1 | 8/2008 | Feezell et al. |
| 2008/0191223 A1 | 8/2008 | Nakamura et al. |
| 2008/0192791 A1 | 8/2008 | Furukawa et al. |
| 2008/0194054 A1 | 8/2008 | Lin et al. |
| 2008/0206925 A1 | 8/2008 | Chatterjee et al. |
| 2008/0211416 A1 | 9/2008 | Negley et al. |
| 2008/0217745 A1 | 9/2008 | Miyanaga et al. |
| 2008/0230765 A1 | 9/2008 | Yoon et al. |
| 2008/0237569 A1 | 10/2008 | Nago et al. |
| 2008/0261381 A1 | 10/2008 | Akiyama et al. |
| 2008/0272463 A1 | 11/2008 | Butcher et al. |
| 2008/0282978 A1 | 11/2008 | Butcher et al. |
| 2008/0283851 A1 | 11/2008 | Akita |
| 2008/0284346 A1 | 11/2008 | Lee |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2009/0028204 A1 | 1/2009 | Hiroyama et al. |
| 2009/0032828 A1* | 2/2009 | Romano et al. ........ H01L 33/00 |
| 2009/0058532 A1 | 3/2009 | Kikkawa et al. |
| 2009/0065798 A1 | 3/2009 | Masui et al. |
| 2009/0071394 A1* | 3/2009 | Nakahata et al. ................ 117/2 |
| 2009/0072252 A1 | 3/2009 | Son et al. |
| 2009/0078944 A1 | 3/2009 | Kubota et al. |
| 2009/0078955 A1 | 3/2009 | Fan et al. |
| 2009/0081857 A1 | 3/2009 | Hanser et al. |
| 2009/0086475 A1 | 4/2009 | Caruso et al. |
| 2009/0095973 A1 | 4/2009 | Tanaka et al. |
| 2009/0140279 A1 | 6/2009 | Zimmerman et al. |
| 2009/0146170 A1 | 6/2009 | Zhong et al. |
| 2009/0155989 A1 | 6/2009 | Uematsu et al. |
| 2009/0173958 A1 | 7/2009 | Chakraborty et al. |
| 2009/0194796 A1 | 8/2009 | Hashimoto et al. |
| 2009/0206354 A1 | 8/2009 | Kitano et al. |
| 2009/0226139 A1 | 9/2009 | Yuang |
| 2009/0227056 A1 | 9/2009 | Kyono et al. |
| 2009/0250686 A1 | 10/2009 | Sato et al. |
| 2009/0262516 A1 | 10/2009 | Li |
| 2009/0267098 A1 | 10/2009 | Choi |
| 2009/0267100 A1 | 10/2009 | Miyake et al. |
| 2009/0273005 A1 | 11/2009 | Lin |
| 2009/0309105 A1* | 12/2009 | Letts ..................... C30B 7/10 257/76 |
| 2009/0309110 A1 | 12/2009 | Raring et al. |
| 2009/0309127 A1 | 12/2009 | Raring et al. |
| 2009/0315057 A1 | 12/2009 | Konishi et al. |
| 2009/0315480 A1 | 12/2009 | Yan et al. |
| 2009/0321745 A1 | 12/2009 | Kinoshita et al. |
| 2009/0321778 A1 | 12/2009 | Chen et al. |
| 2010/0001300 A1 | 1/2010 | Raring et al. |
| 2010/0006873 A1 | 1/2010 | Raring et al. |
| 2010/0006876 A1 | 1/2010 | Moteki et al. |
| 2010/0025656 A1 | 2/2010 | Raring et al. |
| 2010/0032691 A1 | 2/2010 | Kim |
| 2010/0055819 A1 | 3/2010 | Ohba et al. |
| 2010/0067241 A1 | 3/2010 | Lapatovich et al. |
| 2010/0096615 A1 | 4/2010 | Okamoto et al. |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117106 A1 | 5/2010 | Trottier |
| 2010/0117118 A1 | 5/2010 | Dabiran et al. |
| 2010/0140634 A1 | 6/2010 | van de Ven et al. |
| 2010/0148145 A1 | 6/2010 | Ishibashi et al. |
| 2010/0148210 A1 | 6/2010 | Huang et al. |
| 2010/0149814 A1 | 6/2010 | Zhai et al. |
| 2010/0155746 A1 | 6/2010 | Ibbetson et al. |
| 2010/0164403 A1 | 7/2010 | Liu |

(56) References Cited

U.S. PATENT DOCUMENTS

| | | |
|---|---|---|
| 2010/0195687 A1 | 8/2010 | Okamoto et al. |
| 2010/0200888 A1 | 8/2010 | Kuhmann et al. |
| 2010/0220262 A1 | 9/2010 | DeMille et al. |
| 2010/0240158 A1 | 9/2010 | Ter-Hovhannissian |
| 2010/0244055 A1 | 9/2010 | Greisen |
| 2010/0258830 A1 | 10/2010 | Ide et al. |
| 2010/0276663 A1 | 11/2010 | Enya et al. |
| 2010/0290208 A1 | 11/2010 | Pickard |
| 2010/0295054 A1 | 11/2010 | Okamoto et al. |
| 2010/0295088 A1 | 11/2010 | D'Evelyn et al. |
| 2010/0200837 A1 | 12/2010 | Zimmerman et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2011/0001157 A1 | 1/2011 | McKenzie et al. |
| 2011/0017298 A1 | 1/2011 | Lee |
| 2011/0031508 A1 | 2/2011 | Hamaguchi et al. |
| 2011/0037049 A1 | 2/2011 | Tachibana et al. |
| 2011/0038154 A1 | 2/2011 | Chakravarty et al. |
| 2011/0056429 A1* | 3/2011 | Raring .................. C30B 25/02 117/101 |
| 2011/0057167 A1 | 3/2011 | Ueno et al. |
| 2011/0057205 A1 | 3/2011 | Mueller et al. |
| 2011/0062415 A1* | 3/2011 | Ohta et al. ............. H01L 29/66 |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0064103 A1* | 3/2011 | Ohta et al. ................ 372/45.01 |
| 2011/0068700 A1 | 3/2011 | Fan |
| 2011/0075694 A1 | 3/2011 | Yoshizumi et al. |
| 2011/0100291 A1 | 5/2011 | D'Evelyn |
| 2011/0101350 A1 | 5/2011 | Greisen |
| 2011/0101400 A1 | 5/2011 | Chu et al. |
| 2011/0101414 A1 | 5/2011 | Thompson et al. |
| 2011/0103418 A1 | 5/2011 | Hardy et al. |
| 2011/0108081 A1 | 5/2011 | Werthen et al. |
| 2011/0124139 A1 | 5/2011 | Chang |
| 2011/0136281 A1* | 6/2011 | Sheen ............................ 438/46 |
| 2011/0140150 A1 | 6/2011 | Shum |
| 2011/0175200 A1 | 7/2011 | Yoshida |
| 2011/0177631 A1 | 7/2011 | Gardner et al. |
| 2011/0180781 A1 | 7/2011 | Raring et al. |
| 2011/0182056 A1 | 7/2011 | Trottier et al. |
| 2011/0186860 A1 | 8/2011 | Enya et al. |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0198979 A1 | 8/2011 | Shum et al. |
| 2011/0204378 A1 | 8/2011 | Su et al. |
| 2011/0204763 A1 | 8/2011 | Shum et al. |
| 2011/0204779 A1 | 8/2011 | Shum et al. |
| 2011/0204780 A1 | 8/2011 | Shum et al. |
| 2011/0215348 A1 | 9/2011 | Trottier et al. |
| 2011/0216795 A1 | 9/2011 | Hsu et al. |
| 2011/0220912 A1 | 9/2011 | D'Evelyn |
| 2011/0247556 A1 | 10/2011 | Raring et al. |
| 2011/0256693 A1 | 10/2011 | D'Evelyn et al. |
| 2011/0262773 A1 | 10/2011 | Poblenz et al. |
| 2011/0266552 A1 | 11/2011 | Tu et al. |
| 2011/0279054 A1 | 11/2011 | Katona et al. |
| 2011/0279998 A1 | 11/2011 | Su et al. |
| 2011/0281422 A1 | 11/2011 | Wang et al. |
| 2011/0315999 A1 | 12/2011 | Sharma et al. |
| 2011/0317397 A1 | 12/2011 | Trottier et al. |
| 2012/0000415 A1 | 1/2012 | D'Evelyn et al. |
| 2012/0007102 A1 | 1/2012 | Feezell et al. |
| 2012/0043552 A1 | 2/2012 | David et al. |
| 2012/0073494 A1 | 3/2012 | D'Evelyn |
| 2012/0091465 A1* | 4/2012 | Krames et al. ......... H01L 33/32 |
| 2012/0104412 A1 | 5/2012 | Zhong et al. |
| 2012/0118223 A1 | 5/2012 | D'Evelyn |
| 2012/0135553 A1 | 5/2012 | Felker et al. |
| 2012/0137966 A1 | 6/2012 | D'Evelyn et al. |
| 2012/0178215 A1 | 7/2012 | D'Evelyn |
| 2012/0187412 A1 | 7/2012 | D'Evelyn et al. |
| 2012/0199841 A1 | 8/2012 | Batres et al. |
| 2012/0199952 A1 | 8/2012 | D'Evelyn et al. |
| 2012/0235201 A1 | 9/2012 | Shum |
| 2012/0288974 A1 | 11/2012 | Sharma et al. |
| 2012/0299492 A1 | 11/2012 | Egawa et al. |
| 2012/0313541 A1 | 12/2012 | Egawa et al. |
| 2012/0320581 A1* | 12/2012 | Rogers .................... H01L 24/24 362/235 |
| 2013/0016750 A1 | 1/2013 | Raring et al. |
| 2013/0022064 A1 | 1/2013 | Raring et al. |
| 2013/0022758 A1 | 1/2013 | Trottier |
| 2013/0026483 A1 | 1/2013 | Sharma et al. |
| 2013/0043799 A1 | 2/2013 | Siu et al. |
| 2013/0044782 A1 | 2/2013 | Raring |
| 2013/0064261 A1 | 3/2013 | Sharma et al. |
| 2013/0112987 A1 | 5/2013 | Fu et al. |
| 2013/0126902 A1 | 5/2013 | Isozaki et al. |
| 2013/0207148 A1 | 8/2013 | Krauter et al. |
| 2013/0234108 A1 | 9/2013 | David et al. |
| 2013/0313516 A1 | 11/2013 | David et al. |
| 2013/0322089 A1 | 12/2013 | Martis et al. |
| 2014/0042918 A1 | 2/2014 | Lee |
| 2014/0070710 A1 | 3/2014 | Harris |
| 2014/0145235 A1 | 5/2014 | Shum |
| 2014/0175492 A1 | 6/2014 | Steranka et al. |
| 2014/0346524 A1 | 11/2014 | Batres et al. |
| 2014/0346546 A1 | 11/2014 | D'Evelyn et al. |

FOREIGN PATENT DOCUMENTS

| | | |
|---|---|---|
| JP | 06-334215 | 12/1994 |
| JP | 1997-036430 | 2/1997 |
| JP | 09-082587 | 3/1997 |
| JP | H09-199756 | 7/1997 |
| JP | 11-340507 | 12/1999 |
| JP | 11-340576 | 12/1999 |
| JP | 2001-160627 | 6/2001 |
| JP | 2001-177146 | 6/2001 |
| JP | 2002-185085 | 6/2002 |
| JP | 2003-031844 | 1/2003 |
| JP | 2003-037288 | 2/2003 |
| JP | 2000-294883 | 2/2004 |
| JP | 2004-179644 | 6/2004 |
| JP | 2007-507115 | 3/2006 |
| JP | 2006-147933 | 6/2006 |
| JP | 2006-173621 | 6/2006 |
| JP | 2007-110090 | 4/2007 |
| JP | 2008-084973 | 4/2008 |
| JP | 2008-172040 | 7/2008 |
| JP | 2008-263154 | 10/2008 |
| JP | 2008-311640 | 12/2008 |
| JP | 2009-21824 | 1/2009 |
| JP | 2009-147271 | 7/2009 |
| JP | 2010-517274 | 9/2009 |
| JP | 2009-267164 | 11/2009 |
| JP | 2010-034487 | 2/2010 |
| JP | 2010-098068 | 4/2010 |
| JP | 2010-226110 | 10/2010 |
| JP | 2010-263128 | 11/2010 |
| JP | 2011-243963 | 12/2011 |
| WO | WO 2006/062880 | 6/2006 |
| WO | WO 2008/091846 | 7/2008 |
| WO | WO 2009/001039 | 12/2008 |
| WO | WO 2009/066430 | 5/2009 |
| WO | WO 2010/138923 | 2/2010 |
| WO | WO 2010/150880 | 12/2010 |
| WO | WO 2011/010774 | 1/2011 |
| WO | WO 2011/097393 | 8/2011 |
| WO | WO 2012/022813 | 2/2012 |
| WO | WO 2012/024636 | 2/2012 |

OTHER PUBLICATIONS

Hadis Morkoc, "Handbook of Nitride Semiconductors and Devices," vol. 1, 2008, p. 704.*

Aguilar, 'Ohmic n-contacts to Gallium Nitride Light Emitting Diodes', National Nanotechnolghy Infrastructure Network, 2007, p. 56-81.

(56) References Cited

OTHER PUBLICATIONS

Baker et al., 'Characterization of Planar Semipolar Gallium Nitride Films on Spinel Substrates', Japanese Journal of Applied Physics, vol. 44, No. 29, 2005, pp. L920-L922.
Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, pp. 916-929.
Cich et al., 'Bulk GaN based violet light-emitting diodes with high efficiency at very high current density', Applied Physics Letters, Nov. 29, 2012, pp. 223509-1-223509-3.
Csuti et al., 'Color-matching experiments with RGB-LEDs', Color Research and Application, vol. 33, No. 2, 2008, pp. 1-9.
Davis et al., 'Color quality scale', Optical Engineering, vol. 49, No. 3, Mar. 2010, pp. 033602-1-036602-16.
Founta et al., 'Anisotropic Morphology of Nonpolar a-Plane GaN Quantum Dots and Quantum Wells', Journal of Applied Physics, vol. 102, vol. 7, 2007, pp. 074304-1-074304-6.
Hanifin et al., 'Photoreception for Circadian, Neuroendocrine, and Neurobehavioral Regulation', Journal of Physiological Anthropology, vol. 26, 2007, pp. 87-94.
Haskell et al., 'Defect Reduction in (1100) m-plane gallium nitride via lateral epitaxial overgrowth by hydride vapor phase epitaxy', Applied Physics Letters 86, 111917 (2005), pp. 1-3.
Houser et al., 'Review of measures for light-source color rendition and considerations for a two-measure system for characterizing color rendition', Optics Express, vol. 21, No. 8, Apr. 19, 2013, pp. 10393-10411.
Iso et al., 'High Brightness Blue InGaN/GaN Light Emitting Diode on Nonpolar m-Plane Bulk GaN Substrate', Japanese Journal of Applied Physics, vol. 46, No. 40, 2007, pp. L960-L962.
Paper and Board Determination of CIE Whiteness, D65/10 (outdoor daylight)', ISO International Standard 11475:2004E (2004), 18 pgs.
Kim et al., 'High Brightness Light Emitting Diodes Using Dislocation-Free Indium Gallium Nitride/Gallium Nitride Multiquantum-Well Nanorod Arrays', Nano Letters, vol. 4, No. 6, 2004, pp. 1059-1062.
Lu et al., 'Etch-Pits of GaN Films with Different Etching Methods', Journal of the Korean Physical Society, vol. 45, Dec. 2004, p. S673-S675.
International Search Report & Written Opinion of PCT Application No. PCT/US2013/029453, dated Jul. 25, 2013, 11 pages total.
http://www.philipslumileds.com/products/luxeon-flash, 'LUXEON Flash', Philips Lumileds, Aug. 8, 2013, pp. 1-2.
Rea et al., 'White Lighting', Color Research and Application, vol. 38, No. 2, Sep. 3, 2011, pp. 82-92.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Sato et al., 'High Power and High Efficiency Semipolar InGaN Light Emitting Diodes', Journal of Light and Visible Environment, vol. 32, No. 2, Dec. 13, 2007, pp. 57-60.
Sato et al., 'Optical Properties of Yellow Light-Emitting Diodes Grown on Semipolar (1122) Bulk GaN Substrate', Applied Physics Letters, vol. 92, No. 22, 2008, pp. 221110-1-221110-3.
Selvanathan et al., 'Investigation of Surface Treatment Schemes on n-type GaN and Al 0.20Ga0.80N', Journal of Vacuum Science and Technology B, vol. 23, No. 6, May 10, 2005, p. 2538-2544.
Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.
Communication from the Korean Patent Office re 10-2012-7009980 dated Apr. 15, 2013, (6 pages).
Communication from the Japanese Patent Office re 2012-529969, dated Oct. 15, 2013, (6 pages).
Weaver et al., 'Optical Properties of Selected Elements', Handbook of Chemistry and Physics, 94th Edition, 2013-2014, pp. 12-126-12-150.
Whitehead et al., 'A Monte Carlo method for assessing color rendering quality with possible application to color rendering standards', Color Research and Application, vol. 37, No. 1, Feb. 2012, pp. 13-22.
USPTO Office Action for U.S. Appl. No. 12/481,543 dated Jun. 27, 2011 (9 pages).
USPTO Office Action for U.S. Appl. No. 12/491,169 dated Oct. 22, 2010 (9 pages).
USPTO Office Action for U.S. Appl. No. 12/491,169 dated May 11, 2011 (9 pages).
USPTO Office Action for U.S. Appl. No. 12/491,176 dated Mar. 1, 2012 (9 pages).
USPTO Office Action for U.S. Appl. No. 12/491,176 dated Jul. 19, 2012 (13 pages).
USPTO Office Action for U.S. Appl. No. 12/491,176 dated Nov. 22, 2013 (14 pages).
USPTO Office Action for U.S. Appl. No. 12/497,289 dated Feb. 2, 2012 (6 pages).
USPTO Notice of Allowance for U.S. Appl. No. 12/497,289 dated May 22, 2012 (7 pages).
USPTO Office Action for U.S. Appl. No. 12/569,841 dated Dec. 23, 2011 (12 pages).
USPTO Office Action for U.S. Appl. No. 12/569,841 dated Mar. 26, 2013 (17 pages).
USPTO Office Action for U.S. Appl. No. 12/569,841 dated Aug. 13, 2013 (20 pages).
USPTO Office Action for U.S. Appl. No. 12/569,844 dated Oct. 12, 2012 (12 pages).
USPTO Notice of Allowance for U.S. Appl. No. 12/569,844 dated Mar. 7, 2013 (9 pages).
USPTO Office Action for U.S. Appl. No. 12/634,665 dated Mar. 12, 2012 (9 pages).
USPTO Notice of Allowance for U.S. Appl. No. 12/720,593 dated Jul. 11, 2012 (7 pages).
USPTO Office Action for U.S. Appl. No. 12/749,466 dated Jul. 3, 2012 (18 pages).
USPTO Office Action for U.S. Appl. No. 12/749,476 dated Apr. 11, 2011 (14 pages).
USPTO Office Action for U.S. Appl. No. 12/749,476 dated Nov. 8, 2011 (11 pages).
USPTO Notice of Allowance for U.S. Appl. No. 12/749,476 dated May 4, 2012 (8 pages).
USPTO Notice of Allowance for U.S. Appl. No. 12/749,476 dated Jun. 26, 2012 (8 pages).
USPTO Office Action for U.S. Appl. No. 12/785,953 dated Apr. 12, 2012 (11 pages).
USPTO Office Action for U.S. Appl. No. 12/785,953 dated Jan. 11, 2013 (14 pages).
USPTO Office Action for U.S. Appl. No. 12/785,953 dated Oct. 3, 2013 (10 pages).
USPTO Office Action for U.S. Appl. No. 12/861,765 dated Jul. 2, 2012 (11 pages).
USPTO Office Action for U.S. Appl. No. 12/861,765 dated Mar. 7, 2013 (12 pages).
USPTO Office Action for U.S. Appl. No. 12/861,765 dated Sep. 17, 2013 (10 pages).
USPTO Office Action for U.S. Appl. No. 12/879,784 dated Jan. 25, 2012 (6 pages).
USPTO Notice of Allowance for U.S. Appl. No. 12/879,784 dated Apr. 3, 2012 (7 pages).
USPTO Office Action for U.S. Appl. No. 12/880,803 dated Feb. 22, 2012 (8 pages).
USPTO Notice of Allowance for U.S. Appl. No. 12/880,803 dated Jul. 18, 2012 (5 pages).
USPTO Office Action for U.S. Appl. No. 12/914,789 dated Oct. 12, 2011 (7 pages).
USPTO Office Action for U.S. Appl. No. 12/914,789 dated Feb. 24, 2012 (8 pages).
USPTO Notice of Allowance for U.S. Appl. No. 12/914,789 dated May 17, 2012 (5 pages).
USPTO Office Action for U.S. Appl. No. 12/936,238 dated Aug. 30, 2012 (11 pages).

(56) References Cited

OTHER PUBLICATIONS

USPTO Office Action for U.S. Appl. No. 12/936,238 dated Jan. 30, 2013 (12 pages).
USPTO Notice of Allowance for U.S. Appl. No. 12/936,238 dated Apr. 16, 2013 (9 pages).
USPTO Office Action for U.S. Appl. No. 12/995,946 dated Mar. 28, 2012 (17 pages).
USPTO Office Action for U.S. Appl. No. 12/995,946 dated Jan. 29, 2013 (25 pages).
USPTO Office Action for U.S. Appl. No. 12/995,946 dated Aug. 2, 2013 (15 pages).
USPTO Office Action for U.S. Appl. No. 13/014,622 dated Nov. 28, 2011 (13 pages).
USPTO Office Action for U.S. Appl. No. 13/014,622 dated Apr. 30, 2012 (13 pages).
USPTO Office Action for U.S. Appl. No. 13/019,897 dated Mar. 30, 2012 (14 pages).
USPTO Office Action for U.S. Appl. No. 13/019,897 dated Jan. 16, 2013 (7 pages).
USPTO Office Action for U.S. Appl. No. 13/019,897 dated Dec. 2, 2013 (17 pages).
USPTO Office Action for U.S. Appl. No. 13/025,833 dated Jul. 12, 2012 (15 pages).
USPTO Office Action for U.S. Appl. No. 13/135,087 dated Sep. 27, 2013 (7 pages).
USPTO Notice of Allowance for U.S. Appl. No. 13/163,482 dated Jul. 31, 2012 (5 pages).
USPTO Office Action for U.S. Appl. No. 13/179,346 dated Aug. 17, 2012 (17 pages).
USPTO Office Action for U.S. Appl. No. 13/179,346 dated Dec. 13, 2012 (20 pages).
USPTO Office Action for U.S. Appl. No. 13/210,769 dated Apr. 3, 2013 (13 pages).
USPTO Office Action for U.S. Appl. No. 13/210,769 dated Oct. 28, 2013 (9 pages).
USPTO Office Action for U.S. Appl. No. 13/281,221 dated Jun. 21, 2013 (6 pages).
USPTO Notice of Allowance for U.S. Appl. No. 13/281,221 dated Nov. 12, 2013 (10 pages).
USPTO Notice of Allowance for U.S. Appl. No. 13/298,905 dated Jun. 11, 2013 (8 pages).
USPTO Office Action for U.S. Appl. No. 13/328,978 dated May 15, 2013 (24 pages).
USPTO Office Action for U.S. Appl. No. 13/328,978 dated Sep. 26, 2013 (25 pages).
USPTO Office Action for U.S. Appl. No. 13/357,315 dated Oct. 15, 2013 (12 pages).
USPTO Office Action for U.S. Appl. No. 13/465,976 dated Aug. 16, 2012 (16 pages).
USPTO Office Action for U.S. Appl. No. 13/465,976 dated Dec. 20, 2012 (16 pages).
USPTO Office Action for U.S. Appl. No. 13/482,956 dated Aug. 17, 2012 (9 pages).
USPTO Office Action for U.S. Appl. No. 13/482,956 dated Feb. 14, 2013 (15 pages).
USPTO Office Action for U.S. Appl. No. 13/482,956 dated Jul. 22, 2013 (16 pages).
USPTO Notice of Allowance for U.S. Appl. No. 13/482,956 dated Oct. 28, 2013 (9 pages).
USPTO Office Action for U.S. Appl. No. 13/548,635 dated Jun. 14, 2013 (5 pages).
USPTO Notice of Allowance for U.S. Appl. No. 13/548,635 dated Sep. 16, 2013 (6 pages).
USPTO Office Action for U.S. Appl. No. 13/548,770 dated Mar. 12, 2013 (5 pages).
USPTO Notice of Allowance for U.S. Appl. No. 13/548,770 dated Jun. 25, 2013 (6 pages).
USPTO Office Action for U.S. Appl. No. 13/600,988 dated Jul. 18, 2013 (12 pages).
USPTO Notice of Allowance for U.S. Appl. No. 13/600,988 dated Sep. 16, 2013 (9 pages).
USPTO Office Action for U.S. Appl. No. 13/629,366 dated Oct. 31, 2013 (7 pages).
USPTO Office Action for U.S. Appl. No. 13/723,968 dated Nov. 29, 2013 (23 pages).
USPTO Notice of Allowance for U.S. Appl. No. 12/785,953 dated Mar. 20, 2014 (8 pages).
USPTO Office Action for U.S. Appl. No. 12/861,765 dated Mar. 28, 2014 (12 pages).
USPTO Notice of Allowance for U.S. Appl. No. 13/012,674 dated Apr. 30, 2014 (8 pages).
USPTO Office Action for U.S. Appl. No. 13/019,897 dated Jun. 12, 2014 (8 pages).
USPTO Office Action for U.S. Appl. No. 13/304,182 dated May 9, 2014 (12 pages).
USPTO Office Action for U.S. Appl. No. 13/357,578 dated May 13, 2014 (8 pages).
USPTO Office Action for U.S. Appl. No. 13/629,366 dated Apr. 18, 2014 (7 pages).
USPTO Office Action for U.S. Appl. No. 13/904,237 dated May 22, 2014 (13 pages).
USPTO Office Action for U.S. Appl. No. 14/171,885 dated Mar. 28, 2014 (8 pages).
Motoki et al., 'Dislocation reduction in GaN crystal by advanced-DEEP', Journal of Crystal Growth, vol. 305, Apr. 1, 2007, pp. 377-383.
Communication from the Japanese Patent Office re 2013515583 dated Feb. 27, 2014, 2 pages.
USPTO Office Action for U.S. Appl. No. 12/569,841 dated Feb. 14, 2014, 20 pages.
USPTO Office Action for U.S. Appl. No. 13/012,674 dated Jan. 17, 2014, 15 pages.
USPTO Office Action for U.S. Appl. No. 13/781,633 dated Mar. 6, 2014, 12 pages.
Enya, '531nm Green Lasing of InGaN Based Laser Diodes on Semi-Polar {20-21} Free-Standing GaN Substrates', Applied Physics Express, Jul. 17, 2009, vol. 2, pp. 082101.
Fujii et al., 'Increase in the Extraction Efficiency of GaN-Based Light-Emitting Diodes Via Surface Roughening', 2Applied Physics Letters, vol. 84, No. 6, 2004, pp. 855-857.
Kendall et al., 'Energy Savings Potential of Solid State Lighting in General Lighting Applications', Report for the Department of Energy, 2001, pp. 1-35.
PCT Communication Including Partial Search and Examination Report for PCT/US2011/041106, dated Oct. 4, 2011, 4 pages total.
International Search Report of PCT Application No. PCT/US2011/023622, dated Apr. 1, 2011, 2 pages total.
International Preliminary Report & Written Opinion of PCT Application No. PCT/US2011/037792, dated Dec. 6, 2012, 8 pages total.
International Search Report of PCT Application No. PCT/US2011/041106, dated Jan. 5, 2012, 4 pages total.
Schmidt et al., 'High Power and High External Efficiency m-Plane InGaN Light Emitting Diodes', Japanese Journal of Applied Physics, vol. 46, No. 7, 2007, pp. L126-L128.
Shchekin et al., 'High Performance Thin-film Flip-Chip InGaN-GaN Light-Emitting Diodes', Applied Physics Letters, vol. 89, 2006, pp. 071109-1-071109-3.
Tyagi et al., 'High Brightness Violet InGaN/GaN Light Emitting Diodes on Semipolar (1011) Bulk GaN Substrates', Japanese Journal of Applied Physics, vol. 46, No. 7, 2007, pp. L129-L131.
Communication from the German Patent Office re 11 2010 003 697.7 dated Apr. 11, 2013, (6 pages).
Communication from the Japanese Patent Office re 2012-529905 dated Apr. 19, 2013, (4 pages).
Communication from the Chinese Patent Office re 201180029188.7 dated Sep. 29, 2014 (7 pages).
Communication from the Japanese Patent Office re 2013-515583 dated Sep. 12, 2014 (4 pages).
Wierer et al., 'High-Power AlGaInN Flip-Chip Light-Emitting Diodes', Applied Physics Letters, vol. 78, No. 22, 2001, pp. 3379-3381.

(56) References Cited

OTHER PUBLICATIONS

Yamaguchi, 'Anisotropic Optical Matrix Elements in Strained GaN-Quantum Wells With Various Substrate Orientations', Physica Status Solidi (PSS), vol. 5, No. 6, 2008, pp. 2329-2332.
Yoshizumi et al., 'Continuous-Wave Operation of 520nm Green InGaN-Based Laser Diodes on Semi- Polar {2021} GaN Substrates', Applied Physics Express, vol. 2, 2009, pp. 092101-1-092101-3.
Zhong et al., 'High Power and High Efficiency Blue Light Emitting Diode on Freestanding Semipolar (1011) Bulk GaN Substrate', Applied Physics Letter, vol. 90, No. 23, 2007, pp. 233504-1-233504-3.
Zhong et al., 'Demonstration of High Power Blue-Green Light Emitting Diode on Semipolar (1122) Bulk GaN Substrate', Electronics Letters, vol. 43, No. 15, 2007, pp. 825-826.
USPTO Office Action for U.S. Appl. No. 12/883,652 dated Jan. 11, 2013 (11 pages).
USPTO Office Action for U.S. Appl. No. 12/942,817 dated Feb. 20, 2013 (11 pages).
USPTO Office Action for U.S. Appl. No. 13/019,897 dated Dec. 5, 2014 (18 pages).
USPTO Notice of Allowance for U.S. Appl. No. 13/108,645 dated Jan. 28, 2013 (8 pages).
USPTO Office Action for U.S. Appl. No. 13/210,769 dated Oct. 10, 2014 (10 pages).
USPTO Office Action for U.S. Appl. No. 13/291,922 dated Feb. 20, 2013 (9 pages).
USPTO Notice of Allowance for U.S. Appl. No. 13/425,304 dated Aug. 22, 2012 (7 pages).
USPTO Office Action for U.S. Appl. No. 13/425,354 dated Feb. 14, 2013 (12 pages).
USPTO Office Action for U.S. Appl. No. 13/606,894 dated Feb. 5, 2013 (7 pages).
USPTO Notice of Allowance for U.S. Appl. No. 13/781,633 dated Nov. 28, 2014 (9 pages).
USPTO Notice of Allowance for U.S. Appl. No. 13/909,752 dated Sep. 30, 2014 (9 pages).
Communication from the Japanese Patent Office re 2013-263760 dated Nov. 14, 2014 (11 pages).
USPTO Office Action for U.S. Appl. No. 14/181,386 dated Oct. 28, 2014 (10 pages).
USPTO Notice of Allowance for U.S. Appl. No. 14/301,520 dated Nov. 25, 2014 (8 pages).
USPTO Office Action for U.S. Appl. No. 13/014,622 dated Jun. 20, 2014 (15 pages).
USPTO Office Action for U.S. Appl. No. 13/135,087 dated Aug. 15, 2014 (12 pages).
USPTO Notice of Allowance for U.S. Appl. No. 13/304,182 dated Aug. 27, 2014 (8 pages).
USPTO Office Action for U.S. Appl. No. 13/465,976 dated Aug. 25, 2014 (21 pages).
USPTO Office Action for U.S. Appl. No. 13/553,691 dated Sep. 17, 2014 (14 pages).
USPTO Notice of Allowance for U.S. Appl. No. 13/973,213 dated Sep. 16, 2014 (7 pages).
USPTO Office Action for U.S. Appl. No. 14/022,587 dated Jul. 30, 2014 (9 pages).
Tyagi et al., "Partial strain relaxation via misfit dislocation generation at heterointerfaces in (Al,In)GaN expitaxial layers grown on semipolar (112) GaN free standing substrates", *Applied Physics Letters* 95, 2510905 (2009).
Cartwright, 'Quantum Electronics: III_Nitrides Bandgap Calculator', University of Buffalo, Jan. 5, 2015, p. 1.
Communication from the Japanese Patent Office re 2012-5520086 dated Nov. 28, 2014 (6 pages).
USPTO Office Action for U.S. Appl. No. 13/357,578 dated Jan. 28, 2015 (10 pages).
USPTO Office Action for U.S. Appl. No. 13/904,237 dated Dec. 29, 2014 (20 pages).
USPTO Notice of Allowance for U.S. Appl. No. 14/181,386 dated Mar. 2, 2015 (9 pages).
USPTO Office Action for U.S. Appl. No. 14/212,547 dated Jan. 16, 2015 (19 pages).

\* cited by examiner

INDIUM GALLIUM NITRIDE LIGHT EMITTING DEVICES

CROSS REFERENCE TO RELATED APPLICATIONS

The present application claims the benefit under 35 U.S.C. § 119(e) of U.S. Provisional Application No. 61/714,693 filed on Oct. 16, 2012.

Certain embodiments of the present application are related to material disclosed in U.S. Pat. No. 8,482,104, and U.S. Publication No. 2012/0091465, each of which is incorporated by reference in its entirety.

FIELD

The disclosure relates to InGaN-based light-emitting devices fabricated on an InGaN template layer.

BACKGROUND

Today's state-of-the-art visible-spectrum light-emitting diodes (LEDs) and laser diodes (LDs) in the ultraviolet to green (380 nm to 550 nm) regime are based on InGaN active layers grown pseudomorphic to wurtzite GaN. This is true whether the growth substrate is GaN itself, or a foreign substrate such as sapphire or SiC, since in the latter cases GaN-based template layers are employed. Because the lattice constants of GaN and InN are significantly different, InGaN grown pseudomorphically on GaN substrates or layers has significant stress, where the magnitude increases as the In/Ga ratio in the InGaN layer increases.

The built-in stress within the InGaN active layers can make it difficult to achieve high quality material and good device operation. Obtaining high quality material and good device operation becomes progressively more difficult as the InN mole fraction increases, which is a requirement for longer wavelength devices. In addition, for c-plane grown devices, increasing the InN mole fraction also increases the built-in electric fields across the active layers due to spontaneous and piezoelectric polarization fields, reducing the overlap between electrons and holes and decreasing the radiative efficiency. Moreover, there is evidence that material breakdown occurs once the stress level becomes too high, resulting in so-called "phase separation" (see N. A. El-Masry, E. L. Piner, S. X. Liu, and S. M. Bedair, "Phase separation in InGaN grown by metalorganic chemical vapor deposition," Appl. Phys. Lett., vol. 72, pp. 40-42, 1998). Phase separation is exhibited beyond a critical limit of a certain InN mole fraction combined with a certain layer thickness. Such a limit is commonly observed for InGaN layers of about 10% InN grown more than 0.2 µm thick, for example, resulting in "black" or "grey" wafers.

The use of substrates comprising non-polar (1-100), (11-20), and semi-polar planes of GaN can address some of the problems above. In particular, for certain growth planes, the combined spontaneous and piezoelectric polarization vector can be reduced to zero or near-zero, eliminating the electron-hole overlap problem prevalent in c-plane-based devices. Also, improved material quality with higher InN mole fraction can be observed, such as is demonstrated in semi-polar material, which has resulted in continuous-wave (cw) true-green laser diodes (LDs) (see Enya et al., "531 nm green lasing of InGaN based laser diodes on semi-polar {20-21} free-standing GaN substrates," Appl. Phys. Express 2, 082101, 2009; J. W. Raring et al., "High-efficiency blue and true-green-emitting laser diodes based on non-c-plane oriented GaN substrates," Appl. Phys. Express 3, 112101 (2010)). However, the performance of longer-wavelength devices grown on these structures still suffers considerably compared to that of their shorter-wavelength counterparts. Also, it is not clear that growth plane orientation would eliminate the material quality problems associated with strain. Indeed, recent characterization of semi-polar (Al,In,Ga)N heterostructures reveals the formation of a large density of misfit dislocations at heterointerfaces between AlGaN and GaN, for example (see A. Tyagi et al., "Partial strain relaxation via misfit dislocation generation at heterointerfaces in (Al,In)GaN epitaxial layers grown on semipolar (11-22) GaN free standing substrates," Appl. Phys. Lett. 95, 251905, 2009). These dislocations are likely to act as non-radiative recombination centers, and these dislocations may also provide potential degradation mechanisms which may prevent long-life operation (e.g., as is necessary for applications such as solid-state lighting). Further, reported external quantum efficiencies vs. wavelength for LEDs generally show a strong reduction in external quantum efficiency with increasing InN mole fraction, which is often referred to as the "green gap," regardless of growth plane orientation.

SUMMARY

Disclosed herein are light emitting devices. In one embodiment, the light emitting device is formed on a gallium- and indium-containing nitride substrate having an n-type layer overlying the substrate, and having an active layer overlying the n-type layer with a p-type layer overlying the active layer. In this specific embodiment, the gallium- and indium-containing nitride substrate comprises a thickness greater than 4 µm and an InN composition greater than 0.5%.

In another embodiment, a light emitting device is formed of a substrate, an n-type layer overlying the substrate, an active layer overlying the n-type layer; and a p-type layer overlying the active layer. Each of the aforementioned layers is characterized by an in-plane lattice constant greater, by at least 1%, than that of similarly oriented GaN.

In certain aspects, light emitting devices are provided comprising a gallium- and indium-containing nitride substrate; an n-type layer overlying the substrate; an active layer overlying the n-type layer; and a p-type layer overlying the active layer; wherein the gallium- and indium-containing nitride substrate comprises a thickness greater than 4 µm and an InN composition greater than 0.5%.

In certain aspects, light emitting devices are provided comprising a substrate; an n-type layer overlying the substrate; an active layer overlying the n-type layer; and a p-type layer overlying the active layer; each of the n-type layer, the active layer, and the p-type layer is characterized by an in-plane lattice constant, wherein each of the in-plane lattice constants is greater, by at least 1%, than an in-plane lattice constant of similarly oriented GaN.

In certain aspects, methods of fabricating a light emitting devices are provided comprising providing a substrate; selecting an InN composition; fabricating an InGaN template by growing an InGaN epitaxial layer having the selected InN composition on the substrate by hydride vapor phase epitaxy; and growing an optoelectronic device structure on the InGaN template.

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

The patent or application file contains at least one drawing executed in color. Copies of this patent or patent application publication with color drawings will be provided upon request and payment of the necessary fee.

DETAILED DESCRIPTION

Figure 1:
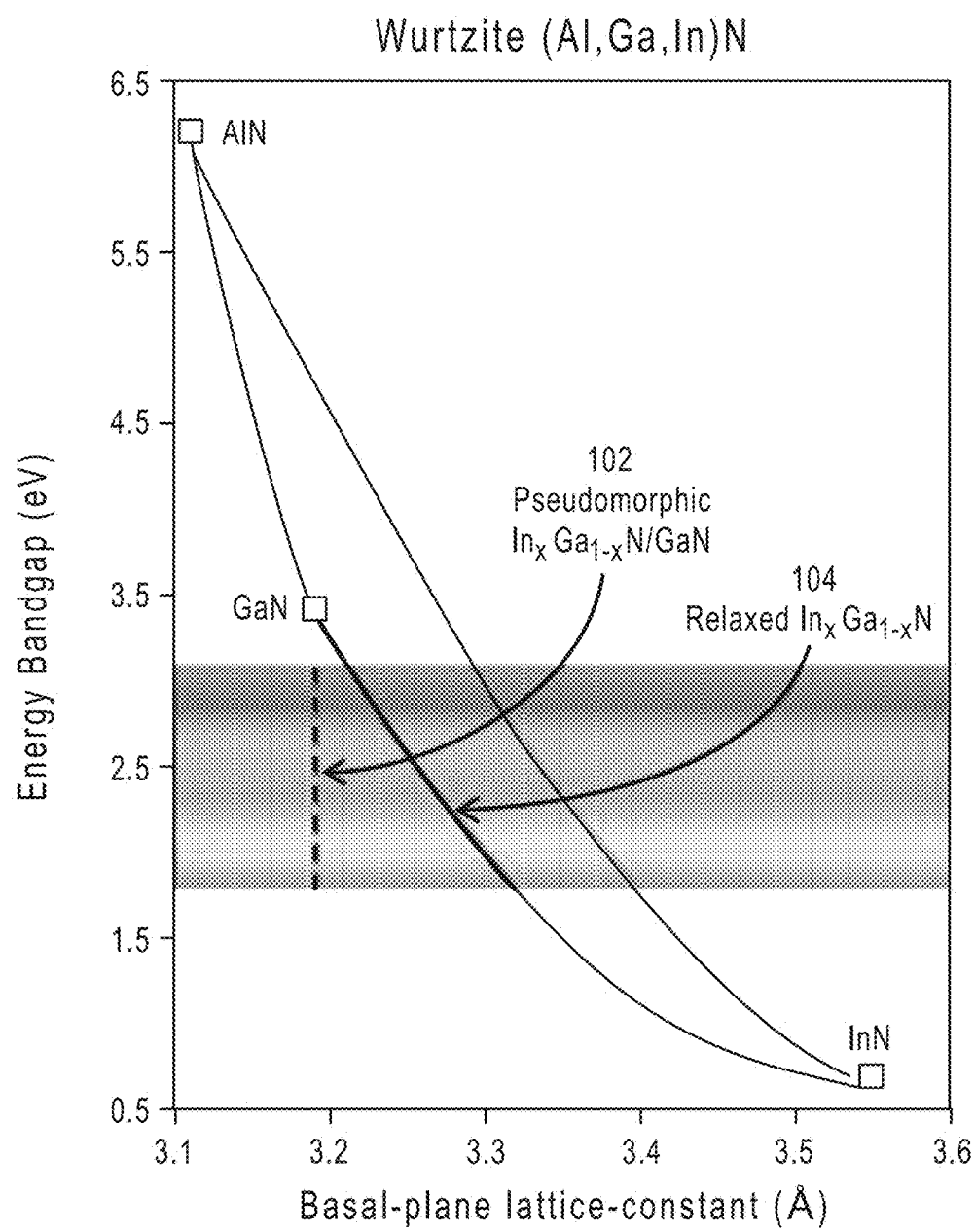
FIG. 1 is a chart 100 showing variation in energy bandgap vs. basal-plane lattice constant.
Figure 2:
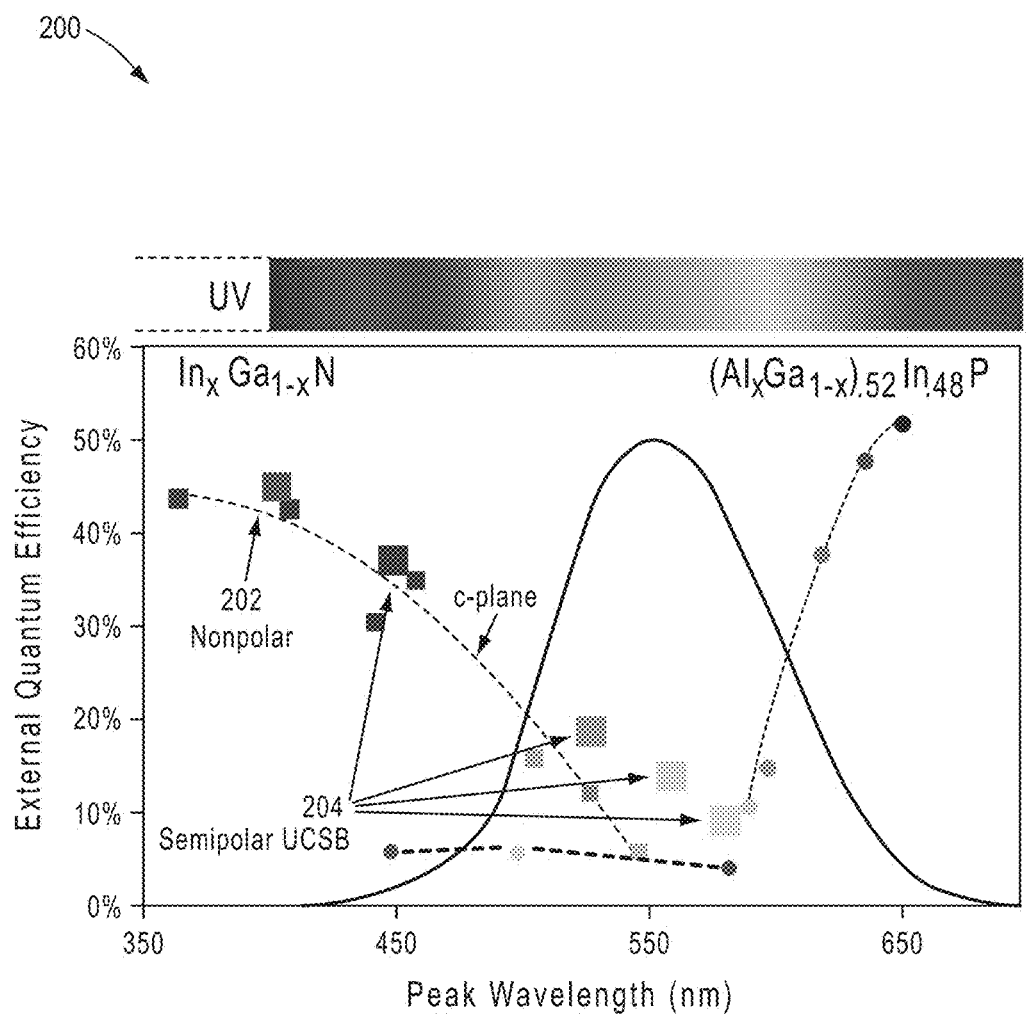
FIG. 2 is a chart 200 showing variation in external quantum efficiency vs. emission wavelength for several light emitting diodes based on InGaN or AlInGaP active layers (from Denbaars, "Fundamental Limits to Efficiency of LEDs," DOE Solid State Lighting Workshop, Raleigh, N.C., Feb. 2-4, 2010.)

Today's state-of-the-art visible-spectrum light-emitting diodes (LEDs) and laser diodes (LDs) in the ultraviolet to green (380 nm to 550 nm) regime are based on InGaN active layers grown pseudomorphic to wurtzite GaN. FIG. 1 exemplifies this situation. Chart 100 shows the variation in energy bandgap vs. basal-plane lattice constant. Pseudomorphic strained-to-GaN curve 102 is shown in juxtaposition to the relaxed InGaN curve 104. Moreover, external quantum efficiencies for LEDs decreases with increasing InN mole fraction, regardless of growth plane orientation. This is depicted in chart 200 of FIG. 2 that shows variations in external quantum efficiency vs. emission wavelength for several light emitting diodes.

In this disclosure, the above problems are circumvented by fabricating InGaN-based light-emitting devices on an InGaN template layer rather than on a layer whose lattice constant is pseudomorphic to GaN. Devices fabricated using this technique exhibit a lower strain mismatch between the template layer and device layers, which results in improved optical performance (e.g., via reduced polarization fields) as well as improved reliability (e.g., resulting from higher crystalline quality). Moreover, in accordance with this disclosure, the long-wavelength range of high-performing light-emitting devices can be extended.

Figure 3:
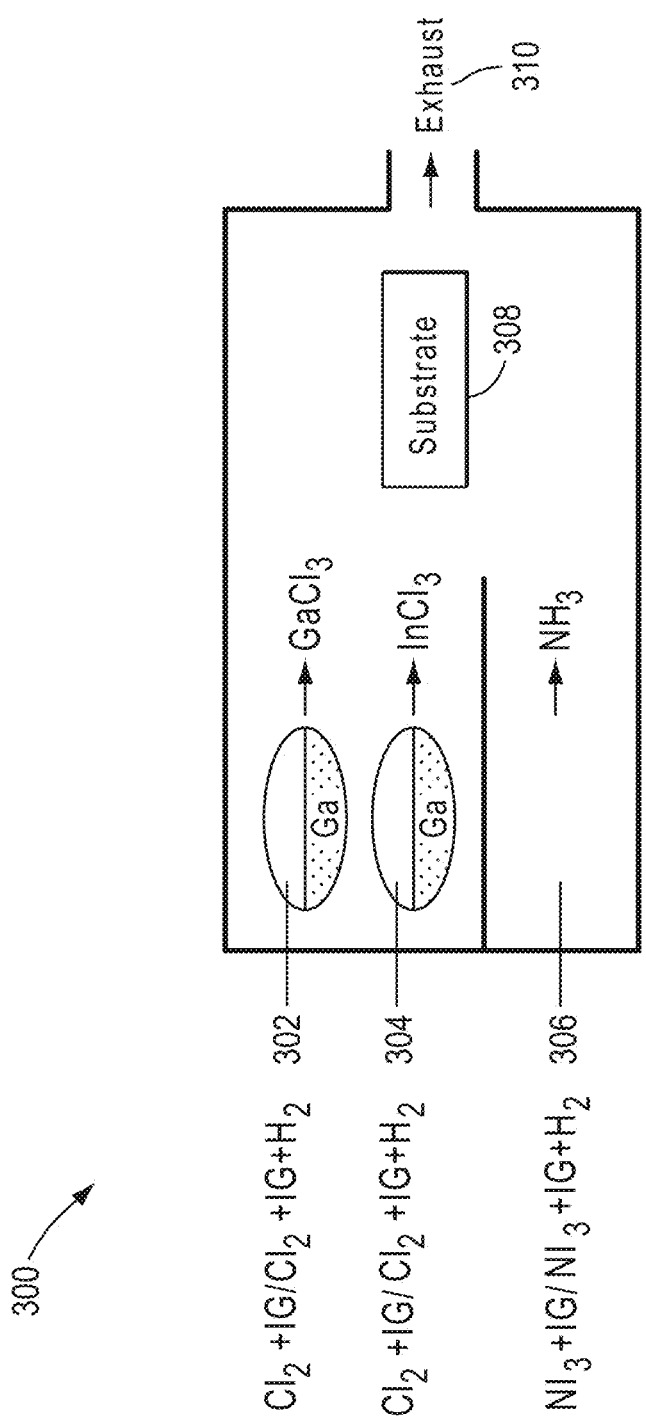
FIG. 3 shows a schematic view 300 of the InGaN HVPE reactor, which consists of the source zone and the deposition zone, according to some embodiments.
Figure 5:
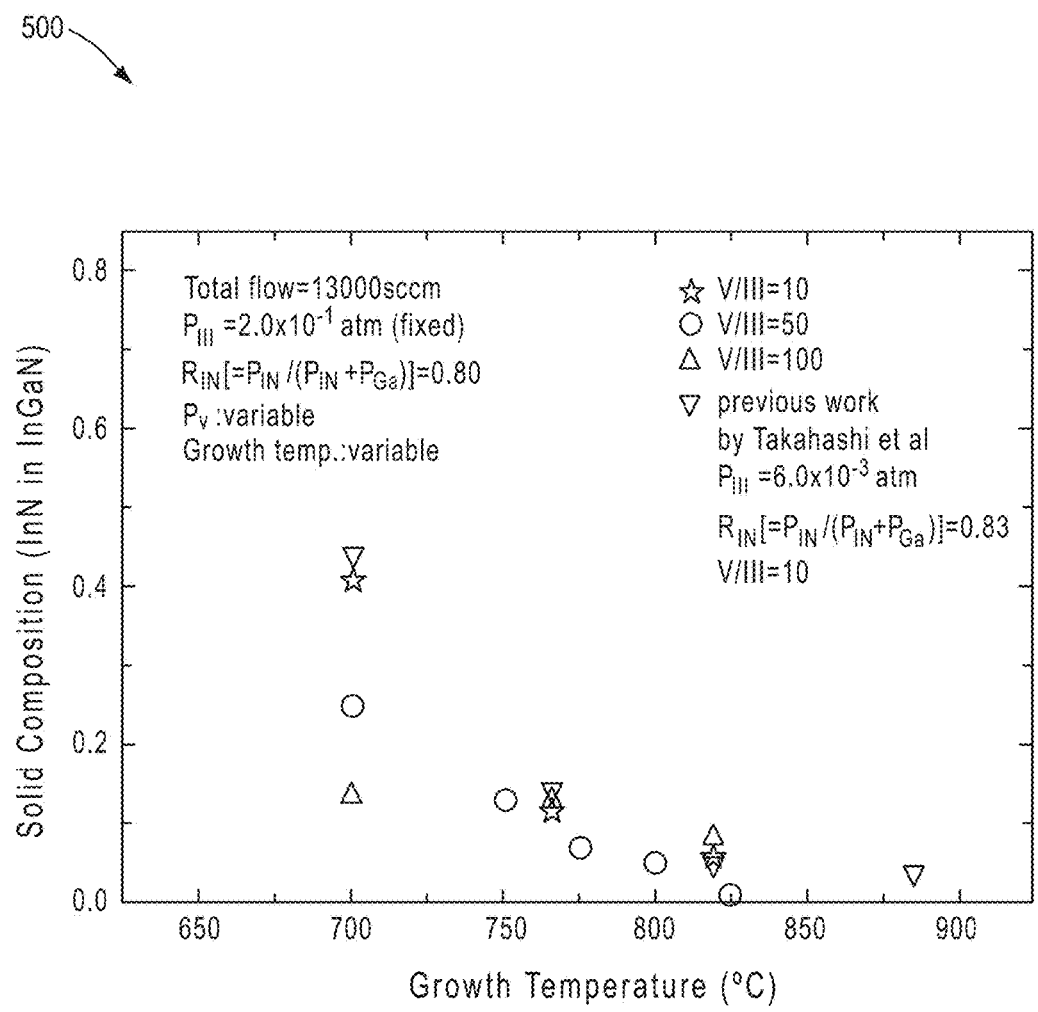
FIG. 5 presents a graph 500 showing solid composition of InGaN as a function of growth temperature, according to certain embodiments.

When carrying out certain embodiments of this disclosure, a seed substrate is placed into a reaction chamber for hydride vapor phase epitaxy deposition of InGaN, to form an InGaN template. FIG. 3 shows a schematic view 300 of an InGaN HVPE reactor that consists of a source zone and a deposition zone (K. Hanaoka, H. Murakami, Y. Kumagai and A. Koukitu, "Thermodynamic analysis on HVPE growth of InGaN ternary alloy," Journal Crystal Growth, vol. 318 (2011) 441-445). In the source zone, two boats for gallium metal and indium metal are located, and the mixture gas of $Cl_2$ and IG (Inert Gas such as nitrogen, helium and argon), or the mixture gas $Cl_2$, IG, and hydrogen feeds into the source boats. In FIG. 5, the reactions representing formation of $GaCl_3$, $InCl_3$, and $NH_3$, are identified as reactions 302, 304, and 306, respectively. The precursors are deposited on substrate 308 and unreacted species exhausted 310 from the HVPE growth apparatus. The group III precursors, $GaCl_3$ and $InCl_3$, are generated by reactions (1) and (2) (below), and are transported into the deposition zone. In substitution for the above reactions, the vapor pressures of $GaCl_3$ and/or $InCl_3$ vaporized from solid $GaCl_3$ and $InCl_3$ sources can be used as the group III precursors. Thus, the relevant reactions are:

$$Ga(s)+1.5Cl_2 \rightarrow GaCl_3 \qquad (1)$$

$$In(s)+1.5Cl_2 \rightarrow InCl_3 \qquad (2)$$

In the deposition zone, the group III precursors and $NH_3$ as the group V precursor are mixed to deposit InGaN alloy on a substrate. The reactions in the deposition zone are expressed by reactions (3) and (4), where the InGaN alloy comprises GaN(alloy) and InN(alloy). The reactions are:

$$GaCl_3+NH_3 \rightarrow GaN(alloy)+3HCl \qquad (3)$$

$$InCl_3+NH_3 \rightarrow InN(alloy)+3HCl \qquad (4)$$

A substantially indium-free seed substrate may be provided. The substrate may comprise one of sapphire, silicon carbide, gallium arsenide, silicon, germanium, a silicon-germanium alloy, $MgAl_2O_4$ spinel, ZnO, BP, $ScAlMgO_4$, $YFeZnO_4$, MgO, $Fe_2NiO_4$, $LiGa_5O_8$, $Na_2MoO_4$, $Na_2WO_4$, $In_2CdO_4$, $LiAlO_2$, $LiGaO_2$, $Ca_8La_2(PO_4)_6O_2$, lithium aluminate, gallium nitride, indium nitride, or aluminum nitride. The substrate may have a wurtzite crystal structure and the surface orientation may be within 5 degrees, within 2 degrees, within 1 degree, within 0.5 degree, within 0.2 degree, within 0.1 degree, within 0.05 degree, within 0.02 degree, or within 0.01 degree of the (0 0 0 1) +c plane, the (0 0 0 −1) −c plane, the {1 0 −1 0} m-plane, the {1 1 −2 0} the a-plane, or to (h k i l) semi-polar plane, where l and at least one of h and k are nonzero and i=−(h+k). In a specific embodiment, the crystallographic orientation of the substrate is within 5 degrees, within 2 degrees, within 1 degree, within 0.5 degree, within 0.2 degree, within 0.1 degree, within 0.05 degree, within 0.02 degree, or within 0.01 degree of {10−1±1}, {1 0 −1 ±2}, {1 0 −1 ±3}, {1 1 −2 ±2}, {2 0 −2 ±1}, {3 0 −3 ±1}, {3 0 −3 ±2}, {2 1 −3 ±1}, or {3 0 −3 ±4}. The substrate may have a cubic crystal structure and the surface orientation may be within 5 degrees, within 2 degrees, within 1 degree, within 0.5 degree, within 0.2 degree, within 0.1 degree, within 0.05 degree, within 0.02 degree, or within 0.01 degree of (1 1 1), (−1 −1 −1), {0 0 1}, or {1 1 0}. The substrate may have a diameter greater than about 5 millimeters, greater than about 10 millimeters, greater than about 15 millimeters, greater than about 25 millimeters, greater than about 40 millimeters, greater than about 70 millimeters, greater than about 90 millimeters, greater than about 140 millimeters, or greater than about 190 millimeters.

In a specific embodiment, the seed substrate is wurtzite GaN and the growth surface is substantially N-face GaN. The seed substrate may have a dislocation density below $10^7$ $cm^{-2}$, below $10^6$ $cm^{-2}$, below $10^5$ $cm^2$, below $10^4$ $cm^{-2}$, below $10^3$ $cm^{-2}$, or below $10^2$ $cm^{-2}$. The seed substrate may have a stacking-fault concentration below $10^3$ $cm^{-1}$, below $10^2$ $cm^{-1}$, below 10 $cm^{-1}$ or below 1 $cm^{-1}$. The seed substrate may have an optical absorption coefficient below 100 $cm^{-1}$, below 50 $cm^{-1}$, below 5 $cm^{-1}$, below 2 $cm^{-1}$, below 1 $cm^{-1}$, or below 0.3 $cm^{-1}$ at wavelengths between about 390 nm and about 700 nm. The seed substrate may have an optical absorption coefficient below 100 $cm^{-1}$, below 50 $cm^{-1}$, below 5 $cm^{-1}$, below 2 $cm^{-1}$, below 1 $cm^{-1}$, or below 0.3 $cm^{-1}$ at wavelengths between about 700 nm and about 3077 nm and at wavelengths between about 3333 nm and about 6667 nm. The top surface of the seed substrate may have an X-ray diffraction ω-scan rocking curve full-width-at-half-maximum (FWHM) less than about 300 arc sec, less than about 200 arc sec, less than about 100 arc sec, less than about 50 arcsec, less than about 40 arcsec, less than about 30 arcsec, less than about 20 arcsec, or less than about 10 arcsec for the lowest-order symmetric and non-symmetric reflections. The top surface of the seed substrate may have been prepared by chemical mechanical polishing and may have a root-mean-square surface roughness less than 1 nanometer, less than 0.5 nanometer, less than 0.2 nanometer, or less than 0.1 nanometer, for example, as measured by atomic force microscopy over an area of at least 10 micrometers by 10 micrometers. In certain embodiments, the crystallographic orientation of the top (growth) surface is within about 0.1 degree of the (000-1) N-face. In certain embodiments, the crystallographic orientation of the top surface is miscut from (000-1) N-face by between about 0.1 and about 10 degrees toward a {10-10} m-plane and is miscut by less than about 0.5 degrees towards an orthogonal {11-20} a-plane. In certain embodiments, the crystallographic orientation of the top surface is miscut from the (000-1) N-face by between about 0.1 and about 10 degrees toward a {11-20} a-plane and is miscut by less than about 0.5 degrees towards an orthogonal {10-10} m-plane. In certain embodiments, the crystallographic orientation of the top surface is miscut from the (000-1) N-face by between about 0.1 and about 10 degrees toward a {10-10} m-plane and is miscut by between about 0.1 and about 10 degrees towards an orthogonal {11-20} a-plane.

In certain embodiments an indium-containing nitride layer is deposited onto the substrate prior to initiating HVPE bulk growth on the substrate. An indium-containing nitride layer may be deposited at relatively low temperature by at least one of molecular beam epitaxy, hydride vapor phase epitaxy, metalorganic chemical vapor deposition, and atomic layer epitaxy. In certain embodiments, alternating layers of a higher-indium composition and a lower-indium composition are deposited. The alternative compositions may be deposited by periodic changes in the gas phase composition above a stationary substrate or by physical transport of the substrate between regions of the reactor providing higher-indium and lower-indium growth environments. Deposition of high-crystallinity layers at low temperature may be facilitated by providing one or more hot wires to assist in the decomposition of gas-phase precursor species, by a plasma, or by similar means. Further details are described in U.S. Publication No. 212/0199952, which is incorporated by reference in its entirety. In certain embodiments, partial or full relaxation of an indium-containing nitride layer on the substrate is performed prior to initiating HVPE bulk growth on the substrate. In certain embodiments, the substrate or a layer deposited thereupon is patterned to facilitate atom transport along glide planes to form misfit dislocations. If desired, a pattern, for example to provide stripes, bottom pillars, holes, or a grid, is formed on the substrate or on an epitaxial layer on the substrate by conventional photolithography or by nanoimprint lithography. Generation of misfit dislocations may be facilitated by roughening the growth surface before deposition, for example, by deposition of nano-dots, islands, ion bombardment, ion implantation, or by light etching. Misfit dislocations may also preferentially be formed by modifying the lattice parameter of the substrate near an epitaxial layer by a process such as atomic diffusion, atomic doping, ion implantation, and/or mechanically straining the substrate. Generation of misfit dislocations may also be facilitated by deposition of a thin layer of $Al_xGa_{(1-x)}N$, for example, thinner than about 10 nanometers to 100 nanometers, followed by annealing to a temperature between about 1000 degrees Celsius and about 1400 degrees Celsius in an ammonia-rich atmosphere. Further details are described in U.S. Publication No. 2012/0091465, which is incorporated by reference in its entirety. In certain embodiments, the indium-containing nitride layer is relaxed, having a-axis and c-axis lattice constants within 0.1%, within 0.01%, or within 0.001% of the equilibrium lattice constants for the specific indium-containing nitride composition.

Figure 4:
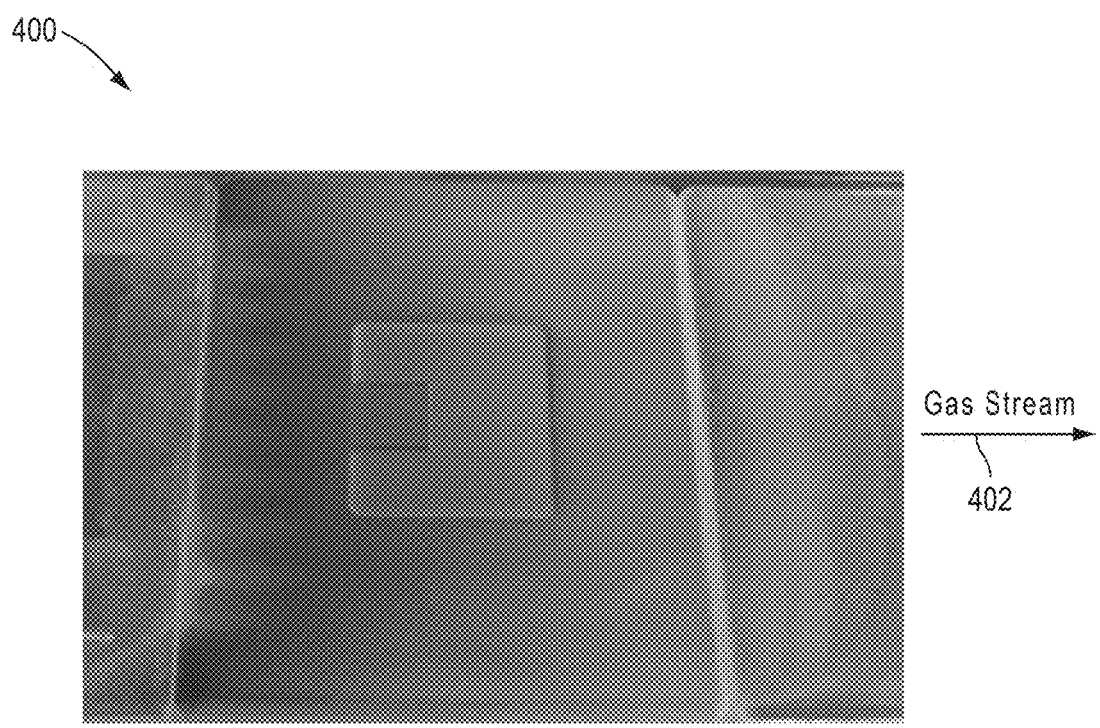
FIG. 4 presents a photograph 400 of a susceptor showing a (000-1) GaN substrate after InGaN growth by HVPE.

Recent results using an N-face (000-1) GaN substrate are disclosed. A mirror-like surface can be obtained. However, in some cases there may be cracks on the surface of the InGaN layer caused by the expansion stress. A photograph 400 of the susceptor showing the (000-1) GaN substrate after InGaN growth is shown below in FIG. 4.

FIG. 5 depicts a graph 500 showing the solid composition of InN in InGaN as a function of the growth temperature. The solid composition of InN in InGaN decreases with increasing temperature. In FIG. 5, previous data is also displayed for InGaN grown by using solid sources, $GaCl_3$ and $InCl_3$ (N. Takahashi, R. Matsumoto, A. Koukitu and H. Seki, "Vapor phase epitaxy of InGaN using $InCl_3$, $GaCl_3$ and $NH_3$ sources," Jpn. Appl. Phys., 36 (1997) pp. L601-L603). The content of the solid compositions of the present samples are similar to that of the previous samples. However, photoluminescence of the previous samples was not observed due to the high impurity concentration in solid sources. In the figure, $P_{III}$ and $P_V$ indicate the input partial pressures of the group III source ($P_{In}+P_{Ga}$) and the group V source ($P_{NH3}$).

Figure 6:
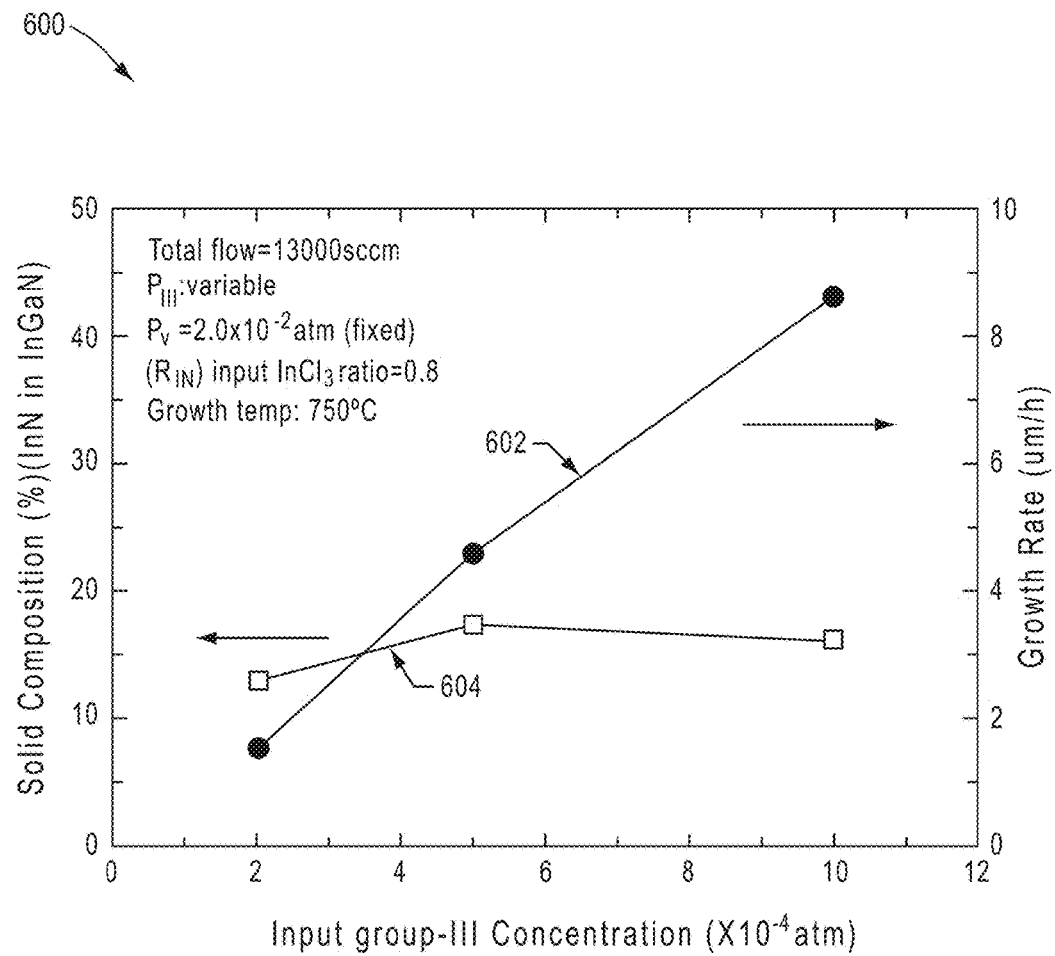
FIG. 6 is a chart 600 showing growth rate and solid composition percentage as a function of an input partial pressure of group III sources $GaCl_3$ and $InCl_3$, according to certain embodiments.

FIG. 6 depicts a chart 600 showing the growth rate (602) and the solid composition (604) as a function of the input partial pressure of the group III sources. The growth rate linearly increases with increasing input pressure, while the solid composition, InN in InGaN, is constant at about 0.16.

Figure 7:
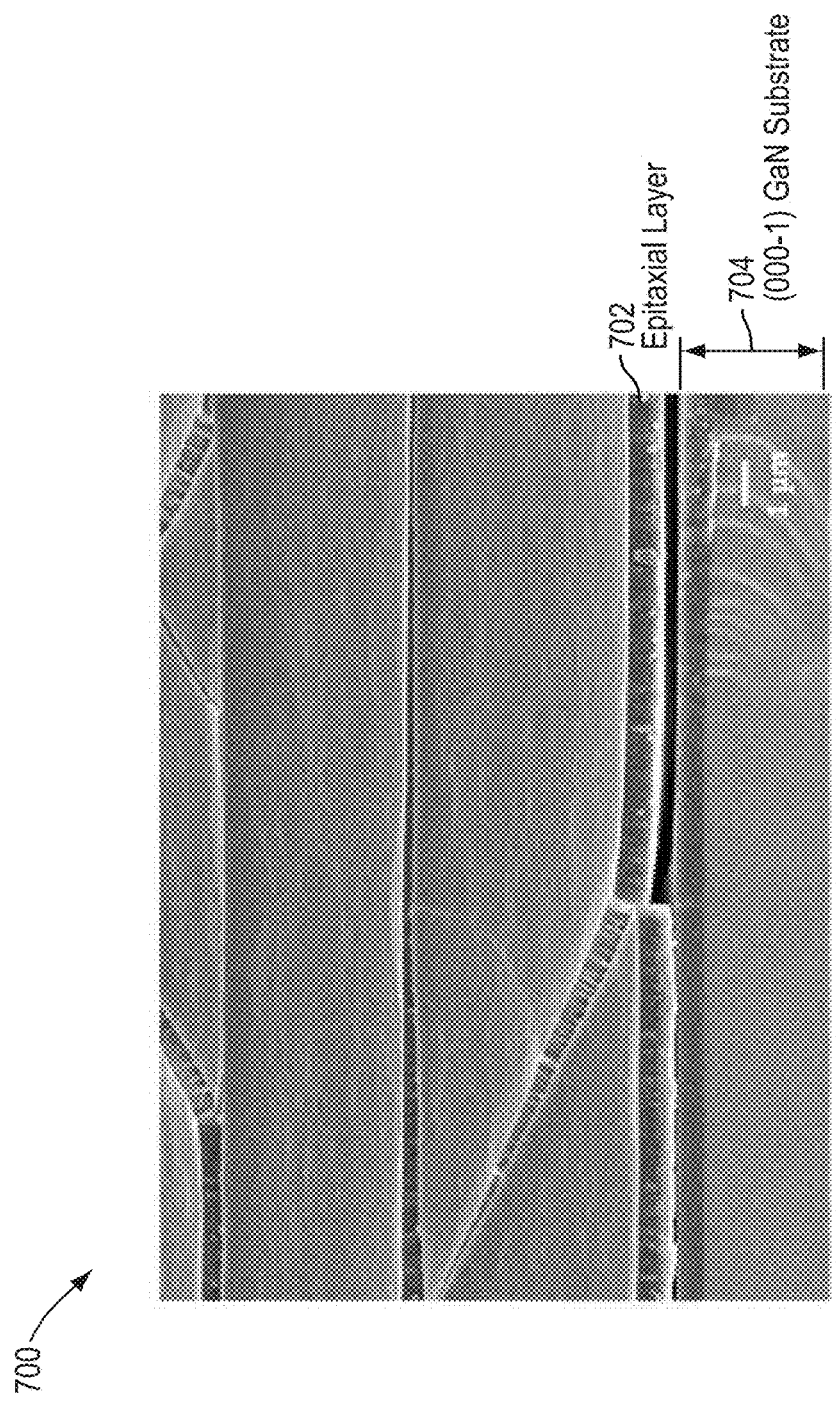
FIG. 7 shows an SEM image 700 of an $In_{0.16}Ga_{0.84}N$ epitaxial layer grown on a (000-1) GaN substrate, according to certain embodiments.

FIG. 7 shows a scanning electron microscope (SEM) image 700 of an $In_{0.16}Ga_{0.84}N$ epitaxial layer grown on a (000-1) GaN substrate of the methods of the present disclosure. The thickness of the epitaxial layer is about 800 nm and the growth rate is about 8.5 μm/h. Because the thickness of InGaN layer is large (about 800 nm), the expansion stress may have caused the cracks on the InGaN surface. Some methods serve to prevent crack formation, resulting in a high quality thick InGaN layer. One such method is the "multi-step grading method." For example, to grow a crack-free $In_xGa_{1-x}N$ film, where x is greater than about 0.05, 0.1, 0.15, 0.2, 0.25, 0.3, 0.4, 0.5, 0.6, 0.7, 0.8, 0.9, or 1.0, it may be desirable to grow a series of layers of graded composition. For example, a graded layer may consist of successive 1-micron thicknesses of $In_{0.2x}Ga_{1-0.2x}N$, $In_{0.4x}Ga_{1-0.4x}N$, $In_{0.6x}Ga_{1-0.6x}N$, $In_{0.8x}Ga_{1-0.8x}N$, followed by a thicker $In_xGa_{1-x}N$ film. In certain embodiments, the thickness of the intermediate-composition layers lies between 10 nanometers and 5 microns. In certain embodiments, the composition is graded continuously rather than as discrete layers with each layer having a fixed InGaN composition.

Figure 8:
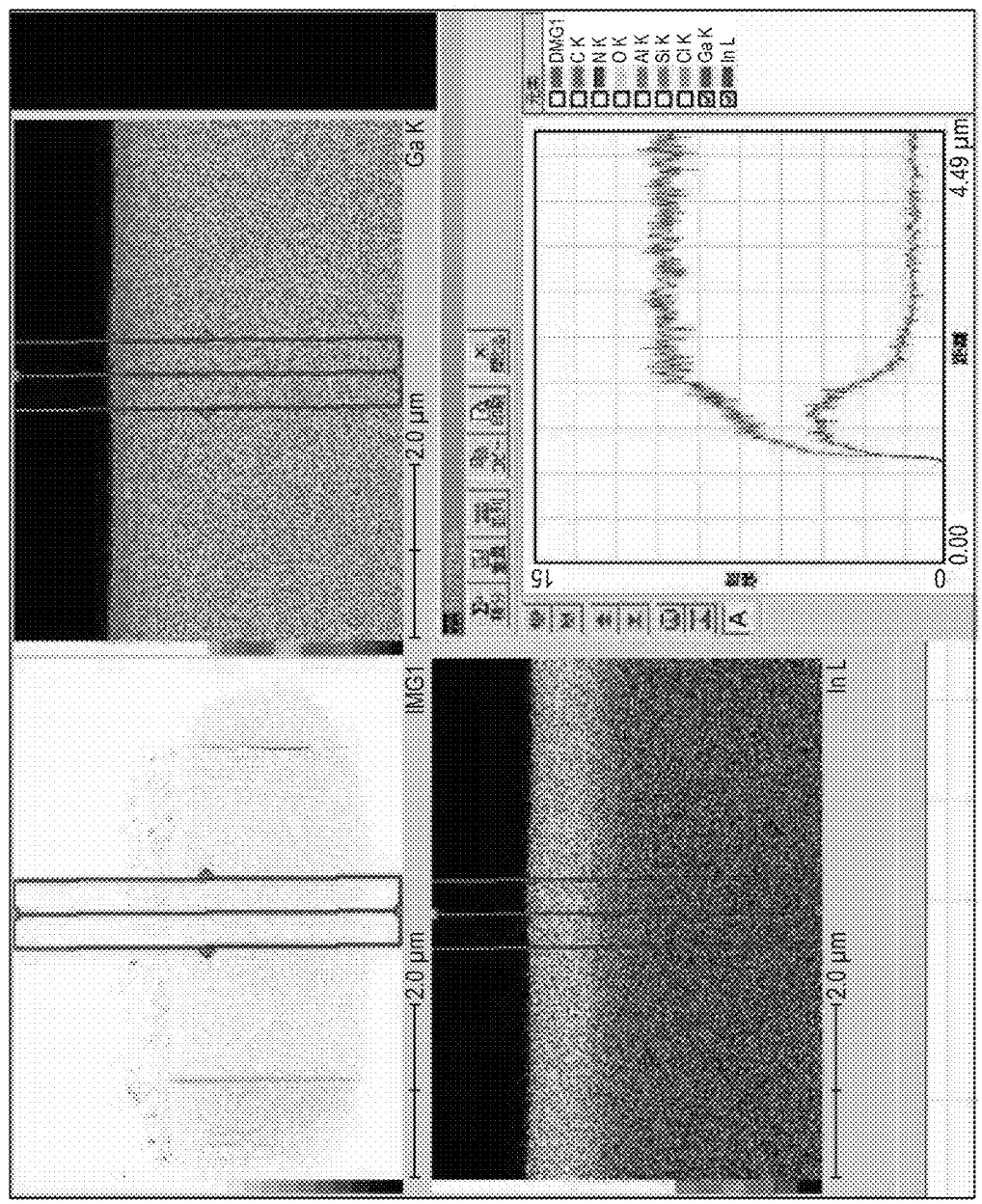
FIG. 8 depicts cross-sectional maps 800 showing energy dispersive X-ray spectroscopy (EDS) data of InGaN on a (000-1) GaN substrate, according to certain embodiments.

FIG. 8 depicts cross-sectional maps 800 showing energy dispersive X-ray spectroscopy (EDS) data of InGaN on —C GaN, using the same sample shown in FIG. 7. Measurement conditions are as follows: accelerating voltage: 20 kV, emission current: 20 μA, spot size: 7, WD: 15 mm, wavelength resolution: 130 eV to 140 eV. From the mapping data, it can be seen that the InGaN layer exhibits a relatively homogeneous solid composition.

Figure 9:
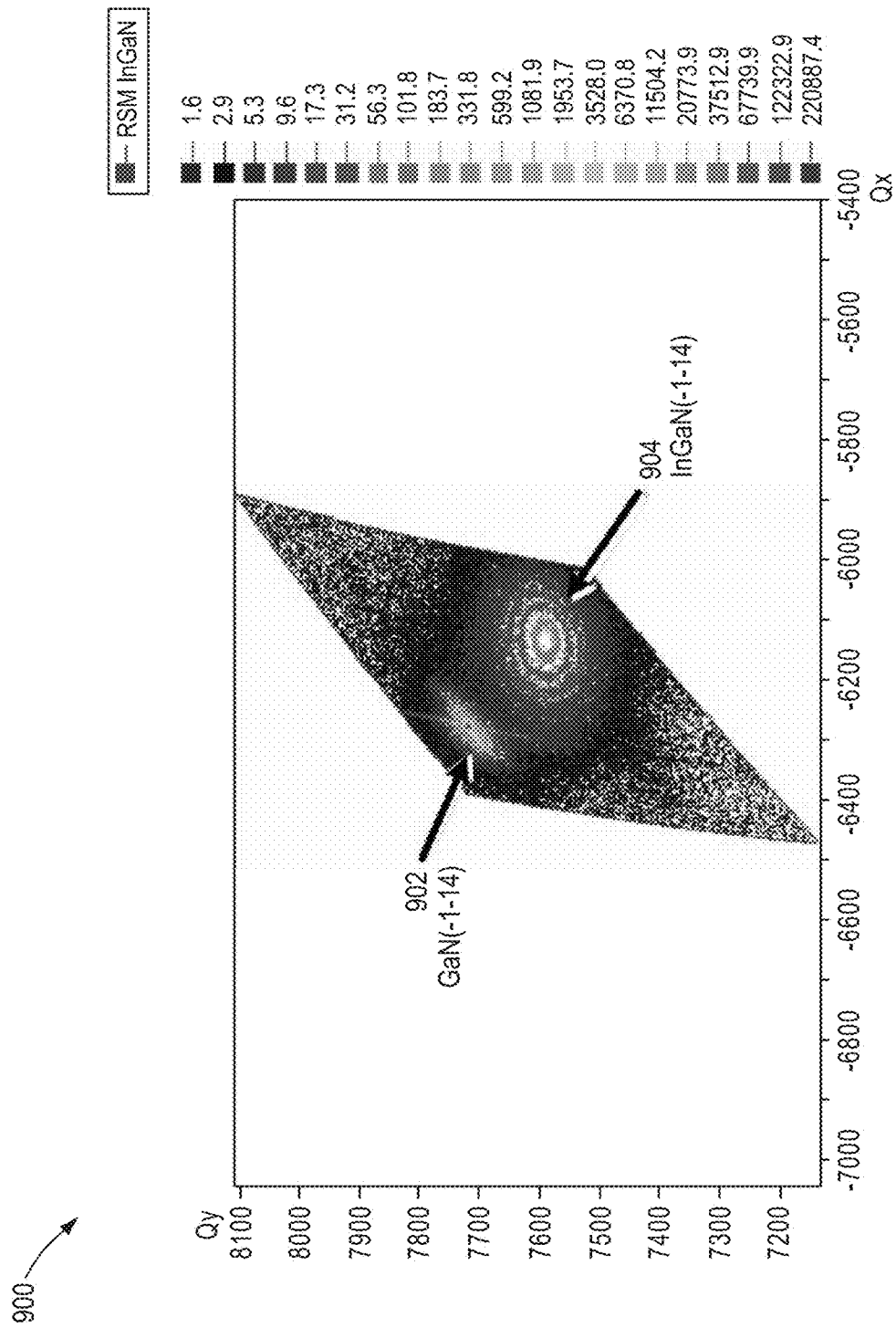
FIG. 9 shows a plot 900 of an X-ray reciprocal space map (RSM) of (−1-14) diffraction for InGaN on a (000-1) GaN substrate grown by HVPE, according to certain embodiments.

FIG. 9 presents a plot 900 showing the reciprocal space map (RSM) of (-1-14) diffraction for InGaN on —C GaN grown by HVPE (same sample shown in FIG. 7). FIG. 9 shows that the InGaN layer is fully relaxed with respect to the GaN substrate because the grown thickness of InGaN is about 800 nm. The lattice constant of InGaN layer is estimated to be a=0.32657 nm and c=0.52712 nm. Assuming that the lattice constant of InGaN follows Vegard's law of linear function between InN and GaN, solid composition x in $In_xGa_{1-x}N$ should be 0.216 (estimation from the a-axis lattice constant). Since the value is somewhat different from that estimated from the c-axis lattice constant of InGaN (x=0.152), residual strain and/or some impurities are thought to be included in the layer.

Figure 10:
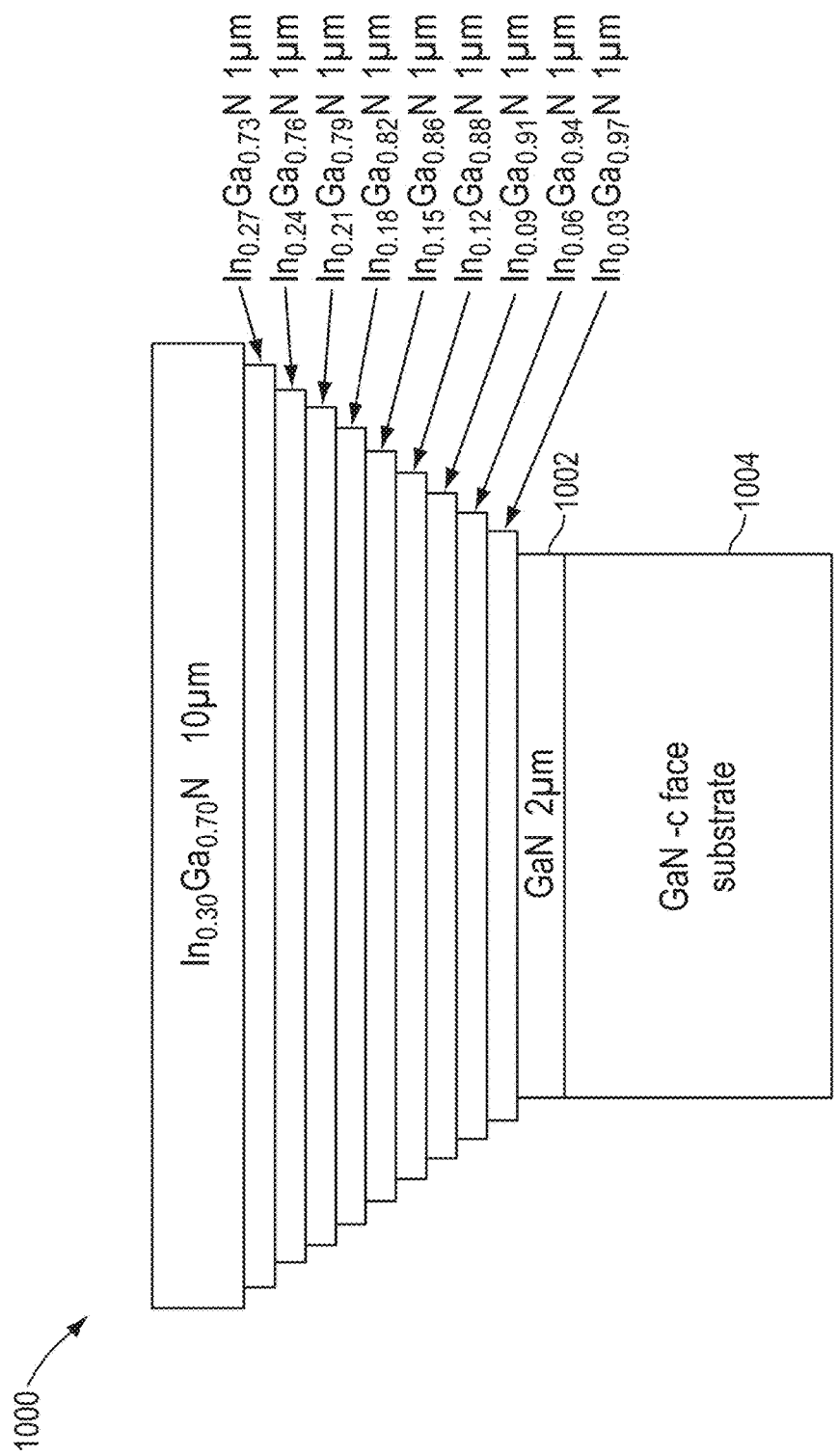
FIG. 10 shows structure 1000 for thick InGaN growth on GaN, according to certain embodiments.

FIG. 10 shows a new structure 1000 for thick InGaN growth without cracks grown using a graded structure, as described above. This structure can be grown using a HVPE reactor described in the present disclosure. The growth rate of InGaN is very fast and it is easy to grow 1 μm-thick multi-step layers (see layers). In certain embodiments, this structure is deposited onto a substrate 1004. A GaN layer 1002 deposited upon the substrate may be patterned to facilitate atom transport along glide planes to form misfit dislocations, as described in U.S. Patent Application Publication. No. 2012/0091465, which is incorporated by reference in its entirety.

There are several ways to provide the final InGaN template suitable for subsequent epitaxial growth and device fabrication. In one embodiment, the InGaN layer is left on its seed substrate. If necessary, a polishing step (e.g., chemical-mechanical polishing) may be provided to prepare the surface for epitaxial growth. In another embodiment, the N-face InGaN material is grown very thick, to several hundred microns or more, to provide a free-standing InGaN crystal or boule. In certain embodiment, the indium-containing nitride crystal or boule is relaxed, having a-axis and c-axis lattice constants within 0.1% within 0.01%, or within 0.001% of the equilibrium lattice constants for the specific indium-containing nitride composition. The InGaN boule may be machined by well-known wafering techniques to provide one or more InGaN wafers. Steps for wafering may include wire-sawing, lapping, polishing, and chemical cleaning steps. A typical wafer thickness may be between 100 and 750 microns, more typically between 250 and 350 microns. In certain embodiments, an InGaN boule or wafer is used as a seed for further bulk growth, for example, by HVPE, by an ammonothermal technique, by a flux technique, or by a solution growth technique. In the case of polar or semi-polar orientations, either the +c or -c orientation surface may be selected preferentially for final preparation for epitaxial growth (that is, the "backside" need not have all the same polishing and or cleaning steps). In certain embodiments it is preferable to remove the original seed substrate at some point in the process.

The InGaN template is provided for device fabrication as follows. Typically, the template is placed in a metal-organic chemical vapor deposition (MOCVD) or molecular beam epitaxy (MBE) reactor for deposition of device quality layers. This is accomplished by reacting tri-methyl (-ethyl) indium, tri-methyl (-ethyl) gallium, and/or tri-methyl (-ethyl) aluminum in the presence of ammonia ($NH_3$) in nitrogen and/or hydrogen carrier gas, at elevated temperatures (500° C. to 1000° C.). The ratio of precursors is selected in order to provide a close lattice match to the InGaN template, and can be controlled by monitoring of mass flow controllers (MFCs), or growth temperature, or by in situ wafer bow measurements. Typically, an n-type InGaN layer is deposited first. The n-type characteristic may be achieved unintentionally (i.e., background oxygen) or intentionally by introducing donor species (e.g., Si via silane). Then, an InGaN or AlGaInN active layer structure is deposited. A common active layer structure is a multiplequantum-well structure. The light-emitting layers are grown with a higher InN mole fraction than the template and the barrier layers (if any) separating the light-emitting layers. The active region may be undoped, n-type doped, or p-type doped. The p-type characteristic is typically achieved by introducing acceptor species (e.g., Mg via $Cp_2Mg$). After the active layers are deposited, a spacer layer may be provided, before growing the p-type layers. The p-type layers may include an InGaN, GaN, AlGaN, or AlGaInN "electron blocking" layer to assist in carrier confinement in the active layers during device operation. After the electron blocking layer, a p-type InGaN layer is grown, followed by an InGaN or GaN p+ contact layer. Typically, after MOCVD growth, the entire structure is annealed at elevated temperature to activate the p-type layers through redistribution of hydrogen which has been grown into the crystal.

Figure 11:
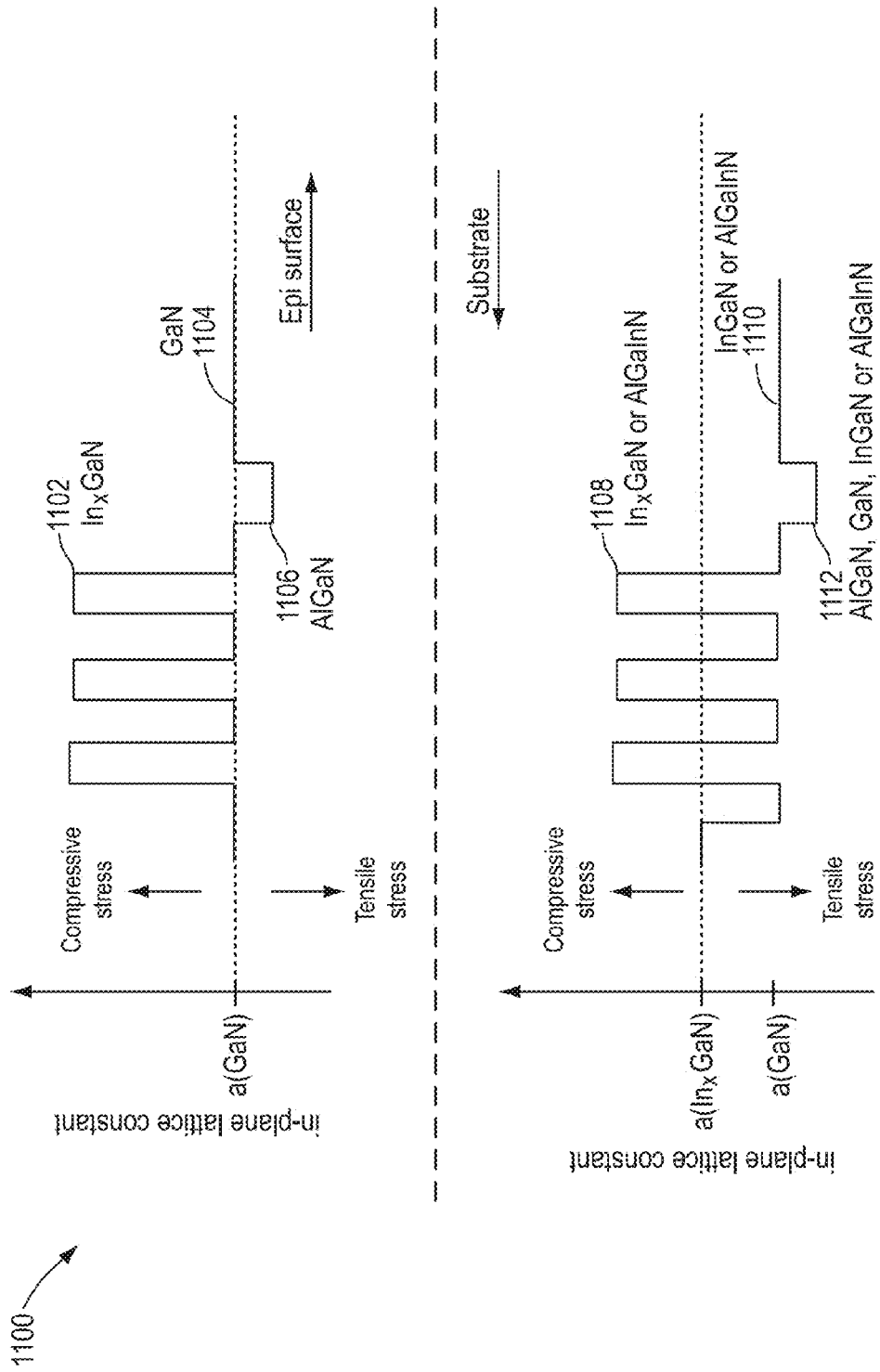
FIG. 11 depicts a comparison chart 1100 showing relative strain for optoelectronic device layer structures on GaN templates as compared with relative strain of optoelectronic device layer structures on InGaN templates, according to certain embodiments.

A device structure is illustrated schematically in comparison chart 1100 of FIG. 11. The top illustration (see features 1102, 1104, and 1106) indicates a device structure where the growth template is a GaN template (on, for example, sapphire, silicon carbide, or silicon) or a GaN substrate. The lattice constant along the in-plane direction is that of GaN and the epitaxial layers are grown pseudomorphically to the GaN template or substrate. The device layers grown thereon include InGaN active (e.g., quantum well) layers and AlGaN (e.g., electron blocking) layers. The native in-plane lattice constants of these tertiary alloys are larger (InGaN) or smaller (AlGaN) than that of GaN, resulting in strong compressive or tensile stress, respectively, in these pseudomorphically grown layers. For long wavelength devices, significant InN is required, resulting in severe compressive stress that can result in poor quality crystal growth and consequently, poor device performance and reliability.

Referring to the bottom illustration (see features 1108 1110, and 1112), and in accordance with the present disclosure, the InGaN template is chosen to provide larger in-plane lattice constant than that of GaN, providing for a strain-compensated design, wherein compressive and tensile stress are balanced out so that the entire crystal structure has strong mechanical integrity. This results in more design freedom, higher crystal quality, and better performance and reliability in devices.

In certain embodiments, the active layer is designed so that the InGaN template is substantially transparent with respect to the wavelength(s) of light emitted by the active layer. For example, if the composition of the InGaN substrate is specified by $In_yGa_{1-y}N$, where $0.05 \le y \le 1$, and the composition of the active layer is designated by $In_xGa_{1-x}N$, where $0.05 \le x \le 1$, x may be chosen to be greater than y by at least about 0.01, at least about 0.02, or at least about 0.05. The resulting compressive strain may be compensated by tensile strain associated with GaN, AlN, AlInGaN, or $In_zGa_{1-z}N$, where $0.0 \le z \le y$, barrier layers, electron-blocking layers, p-type layers, and the like. Of course, many quaternary (AlInGaN) compositions may be suitable for selecting a strain state while providing desired bandgap engineering for the device layer stack.

In certain embodiments, the InGaN template is conductive and a vertical light-emitting device may be fabricated, in which case an ohmic contact electrode is made to the back of the InGaN template. If a lateral or flip-chip device is desired, the n-type electrode is provided after etching through the p-type and active layers down to the n-type epitaxial or n-type InGaN template layers. Suitable n-type ohmic contact metallizations include Ti and Al, and combinations thereof. The p-type electrode is provided on the p+ contact layer. Suitable p-type ohmic contact metallizations include Ni, Au, Pt, Pd, and Ag, and combinations thereof. For light-emitting diodes (LEDs), reflective metallizations are sometimes preferred.

In the case of LEDs, extraction features may be incorporated into one of more exposed surfaces of the wafer. Extraction features may include roughened aspects as well as ordered texturing, including photonic crystal structures. After metal patterning and extraction feature implementation, the wafer may be diced into multiple LED chips, by means such as laser scribe and break, diamond tool scribe and break, sawing, etc. After dicing, further extraction features may be incorporated into the chip side surfaces, by means such as wet chemical etching.

In the case of laser diodes, the wafer may be laser scribed and broken into bars to provide mirror facets for multiple laser stripes. The mirror facets may be coated to provide high-reflectivity or anti-reflection properties, to optimize total laser light output. Then, the individual laser diode chips may be obtained in a further singulation step, which may include another scribe and break step.

After dicing, the light-emitting device is packaged into a suitable housing, and electrical connections are made to the n and p ohmic contacts electrodes. Thermal management is provided by providing a thermally conductive path from the active layers to the package housing. Optical encapsulation and/or lensing may be provided by primary optics comprising, for example, transparent materials such as silicones or glass. The final packaged device may be then incorporated into a solid state lighting product such as a lamp, luminaire, or light engine for displays.

The present disclosure is applicable to various crystal orientations. For example, the growth substrate maybe be polar (+c or −c plane), non-polar (a or m plane), or semipolar (e.g., 11-2±2, 10-1±1, 20-2±1, 30-3±1, 30-3±2, etc.), which will provide for an InGaN template of similar orientation. This allows one to utilize the benefits of the chosen plane (e.g., polarization field reduction) for the InGaN device.

In the foregoing specification, the disclosure has been described with reference to specific embodiments thereof. It will, however, be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are, accordingly, to be regarded in an illustrative sense rather than restrictive sense. In the foregoing specification, the disclosure has been described with reference to specific embodiments thereof.

What is claimed is:

1. A method of fabricating a light emitting device comprising:
providing a first substrate having a crystallographic orientation within about 5 degrees of a −c-plane, the first substrate comprising a bulk gallium nitride substrate, wherein the bulk gallium nitride substrate is a single layer having a top surface of wurtzite GaN;
fabricating an InGaN template by growing an InGaN epitaxial layer having a selected InN composition by hydride vapor phase epitaxy on said bulk gallium nitride such that said InGaN epitaxial layer directly contacts said top surface, wherein said InGaN epitaxial layer has a thickness greater than 4 μm and comprises an InN mole fraction greater than 0.5%, wherein the InGaN epitaxial layer is relaxed, having a-axis and c-axis lattice constants within 0.1% of the respective equilibrium lattice constants for a specific indium-containing nitride composition; and
growing an optoelectronic device structure on one of the InGaN template or a derivative of the InGaN template.

2. The method of claim 1, wherein the growing of the InGaN epitaxial layer is characterized by a crystallographic orientation that is miscut from said −c-plane.

3. The method of claim 2, wherein said crystallographic orientation is miscut from N-face by between about 0.1 and about 10 degrees toward an m-plane.

4. The method of claim 1, wherein the bulk GaN is substantially indium-free.

5. The method of claim 1, wherein growing the InGaN epitaxial layer having the selected InN composition on the first substrate is performed by growing a series of graded InGaN epitaxial layers, wherein each graded InGaN epitaxial layer comprises an increasing InN mole fraction.

6. The method of claim 1, wherein growing the InGaN epitaxial layer having the selected InN composition on the first substrate is performed by growing a layer having a continuously-graded InN composition.

7. The method of claim 1, further comprising separating the InGaN layer having the selected InN composition from the first substrate to form a free-standing InGaN crystal.

8. The method of claim 7, further comprising utilizing the free-standing InGaN crystal as a seed for bulk crystal growth.

9. The method of claim 1, further comprising incorporating the optoelectronic device structure into a light emitting diode or a laser diode.

10. The method of claim 9, further comprising incorporating the light emitting diode or the laser diode into at least one of, a lamp, a luminaire, and a lighting system.

11. The method of claim 1, wherein the InGaN epitaxial layer is characterized by a single (−1-14) x-ray diffraction peak within a reciprocal space map.

12. The method of claim 1, wherein the optoelectronic device structure is grown directly on one of the InGaN template or a derivative of the InGaN template.

13. The method of claim 1, wherein the derivative of the InGaN template is a free-standing InGaN crystal or wafer formed from the InGaN template.

14. The method of claim 1, wherein the derivative of the InGaN template is a free-standing InGaN crystal or wafer formed from a process wherein the InGaN template or a portion thereof is used as a seed for bulk crystal growth.

15. A method of fabricating a light emitting device comprising:
   providing a first substrate having a crystallographic orientation within about 5 degrees of a −c-plane, the first substrate comprising a bulk gallium nitride substrate, wherein the bulk gallium nitride substrate is a single layer having a top surface;
   fabricating an InGaN template by growing an InGaN epitaxial layer having a selected InN composition by hydride vapor phase epitaxy on said bulk gallium nitride substrate such that said InGaN epitaxial layer directly contacts said top surface, wherein the InGaN epitaxial layer has a thickness greater than 4 μm and comprises an InN mole fraction greater than 0.5%;
   growing an optoelectronic device structure on a second substrate selected from one of the InGaN template and a derivative of the InGaN template; and
   wherein the InGaN epitaxial layer is relaxed, having a-axis and c-axis lattice constants within 0.1% of the respective equilibrium lattice constants for a specific indium-containing nitride composition.

16. The method of claim 15, wherein the top surface comprises wurtzite GaN.

17. A light emitting device made from a process comprising:
   providing a first substrate having a crystallographic orientation within about 5 degrees of a −c-plane, the first substrate comprising a bulk gallium nitride substrate, wherein the bulk gallium nitride substrate is a single layer having a top surface;
   fabricating an InGaN template by growing an InGaN epitaxial layer having a selected InN composition by hydride vapor phase epitaxy on said bulk gallium nitride substrate such that said InGaN epitaxial layer directly contacts said top surface, wherein the InGaN epitaxial layer has a thickness greater than 4 μm and comprises an InN mole fraction greater than 0.5%;
   growing an optoelectronic device structure on a second substrate selected from one of the InGaN template and a derivative of the InGaN template; and
   wherein the InGaN epitaxial layer is relaxed, having a-axis and c-axis lattice constants within 0.1% of the respective equilibrium lattice constants for a specific indium-containing nitride composition.

18. The light emitting device of claim 17, wherein the top surface comprises wurtzite GaN.

* * * * *